(12) United States Patent
Neudeck et al.

(10) Patent No.: US 6,461,944 B2
(45) Date of Patent: Oct. 8, 2002

(54) METHODS FOR GROWTH OF RELATIVELY LARGE STEP-FREE SIC CRYSTAL SURFACES

(75) Inventors: Philip G. Neudeck, Olmsted Falls; J. Anthony Powell, North Olmsted, both of OH (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 09/776,998

(22) Filed: Feb. 7, 2001

(65) Prior Publication Data

US 2002/0106842 A1 Aug. 8, 2002

(51) Int. Cl.$^7$ .................... H01L 21/20; H01L 21/36; H01L 21/44; H01L 21/31
(52) U.S. Cl. .................... 438/478; 438/607; 438/931; 438/778
(58) Field of Search .................... 438/478, 607, 438/931, 778

(56) References Cited

U.S. PATENT DOCUMENTS

| | | | | |
|---|---|---|---|---|
| 5,363,800 A | * | 11/1994 | Larkin et al. | 117/95 |
| 5,463,978 A | * | 11/1995 | Larkin et al. | 117/89 |
| 5,501,173 A | * | 3/1996 | Burk, Jr. et al. | 117/84 |
| 5,529,949 A | * | 6/1996 | Stan et al. | 437/100 |
| 5,915,194 A | | 6/1999 | Powell | 438/478 |
| 5,940,723 A | | 8/1999 | Cunningham et al. | 438/508 |
| 6,051,849 A | | 4/2000 | Davis | 257/103 |
| 6,083,812 A | * | 7/2000 | Summerfelt | 438/481 |
| 6,165,847 A | * | 12/2000 | Powell et al. | 438/478 |
| 6,165,874 A | | 12/2000 | Powell | 438/478 |
| 6,255,198 B1 | * | 7/2001 | Linthicum et al. | 438/481 |
| 6,265,289 B1 | * | 7/2001 | Zheleva et al. | 438/503 |
| 2001/0009167 A1 | * | 7/2001 | Davis et al. | 148/33 |
| 2001/0039102 A1 | * | 11/2001 | Zheleva et al. | 438/478 |

OTHER PUBLICATIONS

Ishibashi, et. al. , High Quality GaN films obtained by air–bridged lateral epitaxial growth, Journal of Crystal Growth, 221 (2000) 338–344.*

N. Zaitseva, I. Smolsky and L. Carman "Growth Phenomena in the Surface Layer and Step Generation from the Crystal Growth," published in the Journal of Crystal Growth, vol. 222, No. 1/2 pp. 249–262 (2001).

Powell, et al, "Growth of Step–Free Surfaces on Device Size SiC Mesas", *Applied Physics Letters*, vol. 77, No. 10, pp. 1449–1451 (Sep. 4, 2000).

Davis, et al, "Proceedings of ICSCRM '99, Material Sciences Forum", vol. 338–342, pp. 1471–1476 (1999).

P. Venne'que's, et al, "Reduction Mechanism for Defect Densities in GaN Using One or Two Step Epitaxial Lateral Overgrowth Methods", *J. Appl. Physics*, vol. 87, No. 9, pp. 4175–4181 (2000).

S. J. Pearton, et al, "GaN Processing, Defects, and Devices", *J. Appl. Physics*, vol. 86, No. 1, pp. 1–78 (1999).

* cited by examiner

*Primary Examiner*—Richard Elms
*Assistant Examiner*—Michael K. Luhrs
(74) *Attorney, Agent, or Firm*—Kent N. Stone

(57) ABSTRACT

A method for growing arrays of large-area device-size films of step-free (i.e., atomically flat) SiC surfaces for semiconductor electronic device applications is disclosed. This method utilizes a lateral growth process that better overcomes the effect of extended defects in the seed crystal substrate that limited the obtainable step-free area achievable by prior art processes. The step-free SiC surface is particularly suited for the heteroepitaxial growth of 3C (cubic) SiC, AlN, and GaN films used for the fabrication of both surface-sensitive devices (i.e., surface channel field effect transistors such as HEMT's and MOSFET's) as well as high-electric field devices (pn diodes and other solid-state power switching devices) that are sensitive to extended crystal defects.

51 Claims, 12 Drawing Sheets

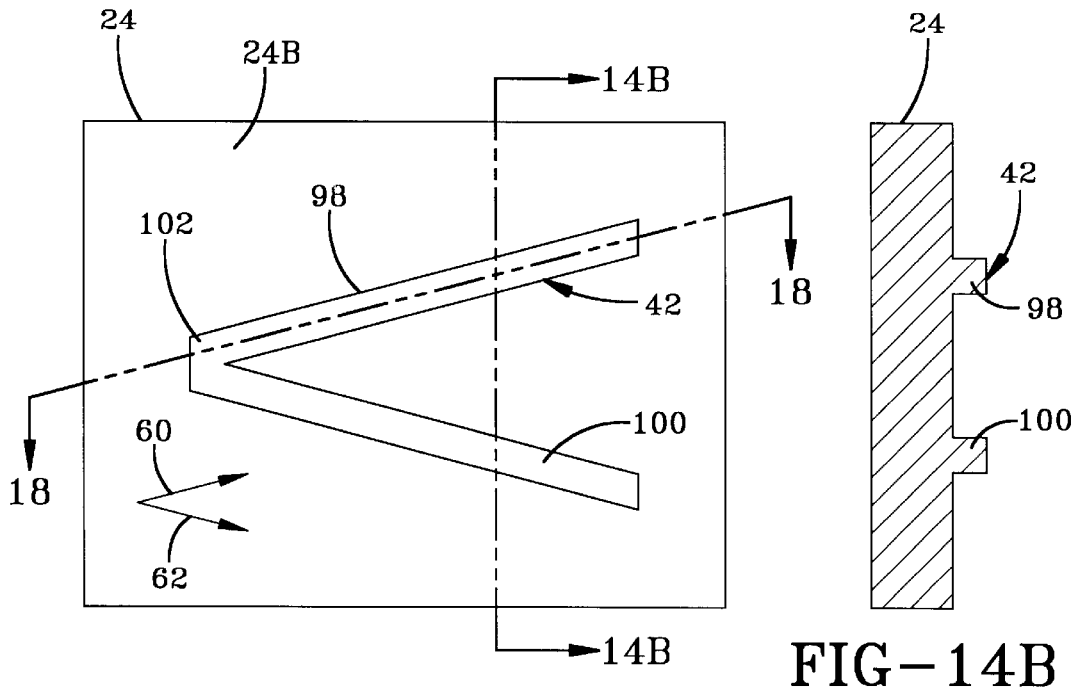
FIG-14A
FIG-14B
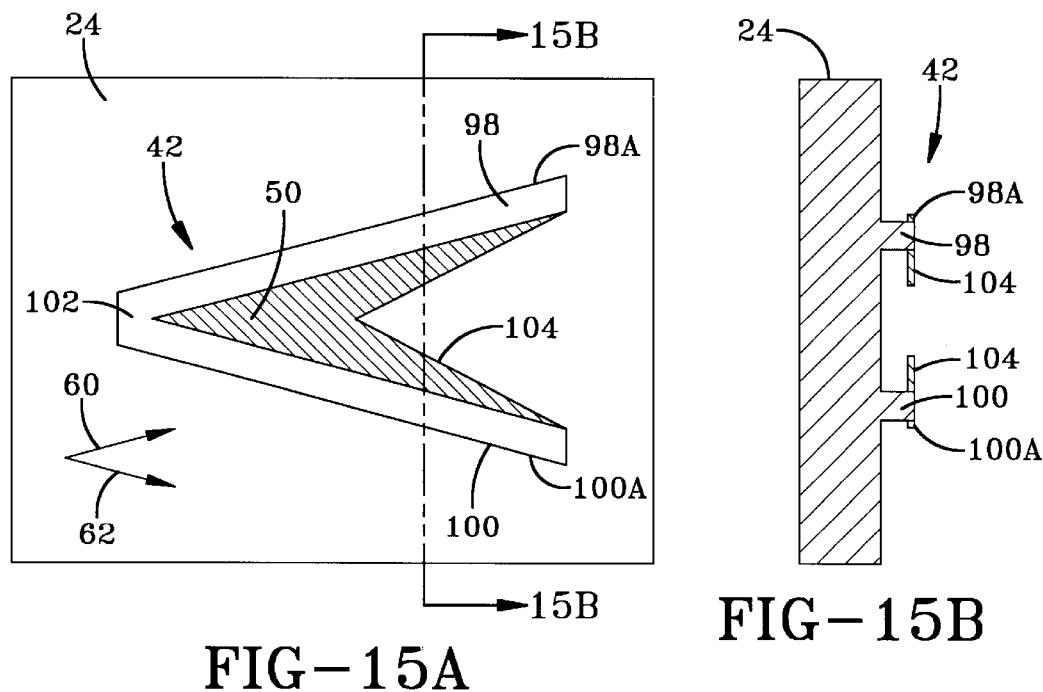
FIG-15A
FIG-15B

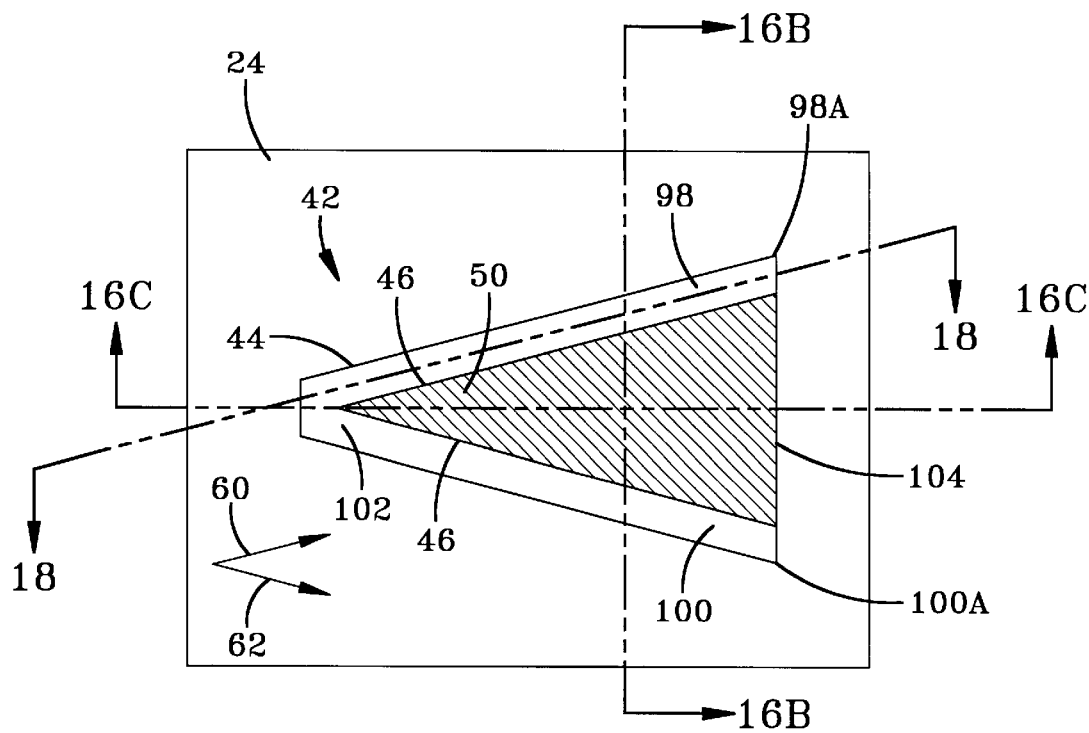
FIG-16A
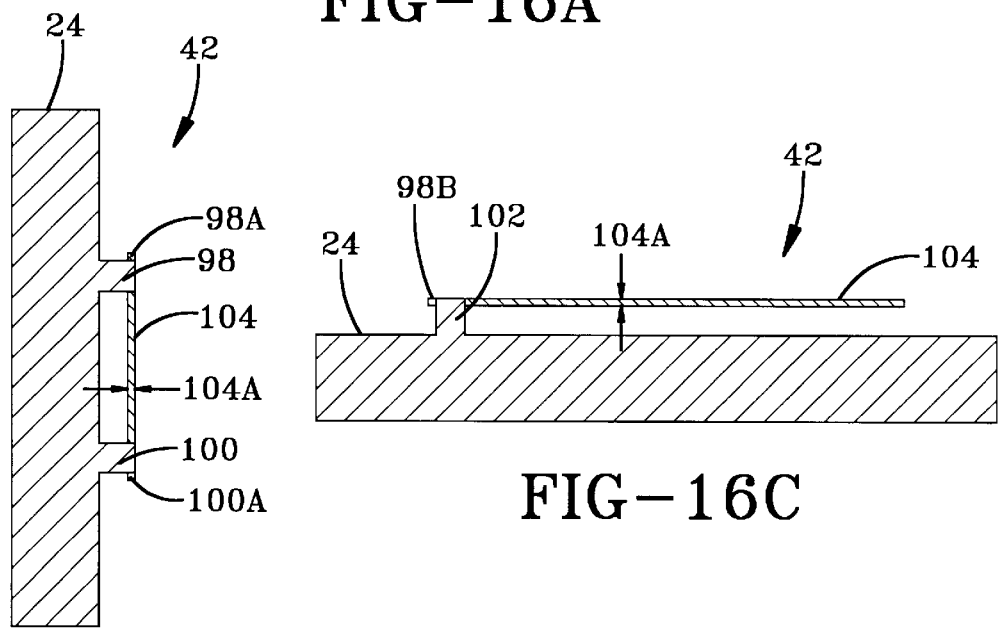
FIG-16B
FIG-16C

METHODS FOR GROWTH OF RELATIVELY LARGE STEP-FREE SIC CRYSTAL SURFACES

ORIGIN OF THE INVENTION

The invention described herein was made by employees of the United States Government and may be used by or for the Government for governmental purposes without payment of any royalties thereon or therefor.

FIELD OF THE INVENTION

The invention relates to the growth of semiconductor device crystal films. Specifically, the invention provides a method for growing arrays of cantilevered web structures on semiconductor wafers. In addition, the cantilevered web can be made step-free (i.e., atomically flat) for fabrication of wide bandgap semiconductor devices. The wide bandgap semiconductor devices find application in high power, high frequency, high temperature and/or high radiation environments, as well as use in optoelectronic devices such as semiconductor lasers and light-emitting diodes.

BACKGROUND OF THE INVENTION

Conventional semiconductors (such as silicon & GaAs) are unable to meet some of the increasing demands of the automobile and aerospace industries as they move to smarter and more electronic systems. New wide bandgap (WBG) materials are being developed to meet the diverse demands for more power at higher operating temperatures. Two of the most promising emerging wide bandgap semiconductors are silicon carbide (SiC) and Gallium Nitride (GaN). At over three electron volts, the bandgap of these materials is nearly three times as large as that of silicon. This advantage theoretically translates into very large improvements in power handling capabilities and higher operating temperatures that will enable revolutionary product improvements. Once material-related technology obstacles are overcome, SiC's properties are expected to dominate high power switching and harsh-environment electronics for manufacturing and engine control applications, while GaN will enable high power high frequency microwave systems at frequencies beyond 10 GHz. To date the best SiC devices to our knowledge are homojunction (i.e., wafer and device layers are all hexagonal SiC), while GaN devices are heterojunction (i.e., SiC or sapphire wafers with device layers of GaN, AlGaN, AlN, etc.) because production of bulk GaN wafers is not practical at the present time.

While great advances have been made in recent years, significant fundamental materials problems persist that severely hinder commercialization and beneficial system insertion of wide bandgap electronics. One of the most intransigent of these problems is the high structural defect (e.g., dislocation) density in SiC and GaN layers in which electronic devices are constructed. Another is the very rough surface structure of SiC (relative to silicon surfaces) which inhibits the performance and reliability of various device structures, especially SiC-based MOSFET's. (Silicon-based MOSFET's are the transistor of choice in greater than 95% of all semiconductor chips produced today). This rough surface of SiC also degrades the quality of GaN layers grown on SiC, which nevertheless still yields the most promising GaN/AlGaN devices reported to date.

A number of prior art processes have been developed that contribute somewhat to the solution of the problem of defects and the rough surfaces that are produced in current epitaxial film growth processes. However, each of these prior art processes has limitations and disadvantages.

Prior art processes having many advantages are described in U.S. Pat. Nos. 5,915,194 and 6,165,874. These processes can produce step-free (atomically-flat) surfaces on the top of arrays of small mesas (flat-topped, protruding regions on a semiconductor wafer) that are etched into the surface of commercially-produced SiC wafers. The disadvantage of this prior art process is that the area sizes of the step-free mesas are limited by the defect density (e.g., screw dislocations) in the SiC wafer as described in the technical article entitled "Growth of Step-Free Surfaces on Device Size SiC Mesas" of Powell and Neudeck et al published Sep. 4, 2000, in Applied Physics Letters, Volume 77, number 10, pages 1449 to 1451. For current typical commercial SiC wafers this places a practical maximum area mesa size for a step-free surface at about 200 $\mu$m×200 $\mu$m. There are many semiconductor devices, which are larger than this rendering inadequate the 200 $\mu$m×200 $\mu$m step-free areas for some important device applications. In particular, high current power devices typically require larger areas than 200 $\mu$m×200 $\mu$m.

Another prior art process is lateral epitaxial overgrowth (LEO) (also commonly referred to as ELO for extended lateral overgrowth) of semiconductor films used to produce films with reduced defect density that is described by the authors Davis et al., given in the proceedings of ICSCRM '99, Materials Science Forum, Vols. 338–342, pp. 1471–1476 and references therein, as well as U.S. Pat. No. 6,051,849 of Davis et al. An example of this reduced density is the ELO of GaN and AlN films on SiC and sapphire substrates; this includes the so called, known in the art, "pendeo-epitaxy" of GaN. A problem with these forms of ELO is that growth takes place in both vertical and lateral directions. Therefore, the material deposited to grow the prior art ELO film vertically necessarily reduces the lateral direction growth rate which is desired to be high to maximize the practical lateral extent of the overgrowth region. Also, the ELO process does not produce a step-free top surface. Also, the vertical growth above the original "seed" crystal surface disadvantageously contains a high density of defects. Finally, the region of coalescence of films grown from adjacent seed areas can be defective. Dislocation defects are described in the technical article of P. Venne'gue's, B. Beaumont, V. Bousquet, M. Vaille, and P. Gibart, entitled "Reduction Mechanisms for Defect Densities in GaN Using One or Two-Step Epitaxial Lateral Overgrowth Methods," published in J. Appl. Phys., vol. 87, no. 9, pp. 4175–4181, 2000. The technical article of P. Venne'gue's gives examples of dislocation defects, for both of those formed above the original seed and for those formed in the region of coalescence, that result from the present ELO processes. In order to achieve useful device size (area) with present ELO process, coalescence (and resulting imperfections) is required. It is desired that a process for growing large-area devices be provided that does not suffer the drawbacks of the prior art.

It is well known that dislocation defects in III-nitride layers are known to degrade the performance and reliability of III-nitride electronic devices. Some examples of dislocation-related degradation of lasers and other devices are described in the technical article of S. J. Pearton, J. C. Zolper, R. J. Shul, and F. Ren, entitled "GaN: Processing, Defects, and Devices," published in J. Appl. Phys., vol. 86, no. 1, pp. 1–78, 1999. Further examples are described in the references referred to in the technical article of S. J. Pearton et al.

OBJECTS OF THE INVENTION

It is a primary object of the present invention to provide a method for growing arrays of large-area-device-size films having step-free surfaces in excess of about 200 $\mu$m×200 $\mu$m (i.e., the practical area limitation imposed by screw dislocations in SiC wafers).

It is another object of the present invention to produce a large-area step-free surface that can be used for subsequent heteroepitaxial growth of improved quality 3C-SiC, AlN, GaN, and other semiconductor materials with few defects.

In addition, it is an object of the present invention to provide a method that uses lateral growth behavior of step-free SiC mesas as the basis for the formation of cantilevers at the top edges of the mesas. Hence, after the top surface becomes step-free, there is only lateral growth (i.e., no vertical growth as in other prior art processes).

Moreover, it is an object of the present invention to provide a method that yields larger areas of atomically flat surfaces larger than the prior art 200 $\mu$m×200 $\mu$m limitation imposed by substrate defects (e.g., screw dislocations) for fabrication of electrical and optical devices.

Furthermore, it is an object of the present invention to provide a method that yields lateral overgrowth that terminates vertical propagation of dislocations, whose elimination is beneficial to associated devices.

Further still, it is an object of the present invention to provide a method whose resulting larger-area atomically-flat surfaces enable the benefits of atomically-flat surface to be practiced on larger-area (i.e., higher current) devices.

In addition, it is an object of the present invention to provide a method that yields improved semiconductor products including (1) short wavelength optical devices, such as blue and green light emitting diodes (LED's) and solid state diode lasers (e.g., the blue laser), and (2) electronic devices, such as high frequency GaN devices for communications and high power SiC devices for industrial electronics.

Another object of the present invention is to provide a method that yields cantilevered growth.

In addition, an object of the present invention is to provide a method that yields cantilevered web growth.

SUMMARY OF THE INVENTION

The practice of the present invention is particularly related to step-free surfaces and crystal films and is primarily based on at least several recent observations. First, under certain conditions of growing step-free surfaces on SiC mesas, lateral growth occurs around the top edge of the mesa in a manner which increases the area of the step-free epitaxial film beyond the vertical sidewalls of the mesa. This lateral growth creates a cantilevered-type epitaxial film structure whose top surface is an extension of the step-free surface. In addition, the amount of extension is a function of crystallographic direction. Also, at the inside corner of a cross-shaped mesa, a webbed film structure is formed which bridges the gap between arms of the cross-shaped mesa. The web film structure bridges the top edge of the arms of a cross-shaped mesa. The formations operatively cooperate with each other to provide the enlarged step-free surfaces of the present invention.

The method of the present invention, in one embodiment, produces single-crystal structures with cantilevered web features on a single-crystal substrate. The method comprising the steps of choosing a single-crystal substrate material which exhibits a property that the material contains at least one growth plane orientation, whereby under selected growth conditions the growth rate due to step-flow growth is greater than at least one hundred (100) times the growth rate due to growth involving two-dimensional nucleation. The method further comprises preparing a planar growth surface on the substrate that is parallel to within a predetermined angle relative to a selected crystal plane of the substrate and then removing material in the first growth surface so as to define at least one selected separated second growth surface defined by a boundary, wherein the boundary has at least one concave border. The method further includes treating the substrate so as to remove any removable sources of unwanted crystal nucleation and any removable sources of steps and then depositing a homoepitaxial film on the second separated growth surface under selected conditions so as to provide a step-flow growth, while suppressing two-dimensional nucleation. The method further comprises continuing the deposition of the homoepitaxial film so that the step-flow growth results and produces a cantilevered web structure growing from the concave border, and continuing the deposition of the homoepitaxial film until a third separated growth surface of a desired size and shape is achieved.

In another embodiment, a method produces cantilevered atomically flat top surfaces on single-crystal substrates. The method comprises the steps of choosing a single crystal substrate material which exhibits the property that the material contains at least one growth plane orientation whereby under selected growth conditions the growth rate due to step-flow growth is greater than at least one hundred (100) times a growth rate due to growth involving two-dimensional nucleation. The method further includes preparing a planar first growth surface on the substrate that is parallel to within a predetermined angle relative to a selected crystal plane of said substrate. The method further includes removing material in the first growth surface so as to define at least one selected separated second growth surface defined by a boundary. The method further includes depositing a homoepitaxial film on the second separated growth surface under selected conditions so as to provide a step-flow growth while suppressing two-dimensional nucleation. The method continues the deposition of the homoepitaxial film so that said step-flow growth results and produces a cantilevered structure growing on the second growth surface. The method further continues the deposition of the homoepitaxial film until a cantilevered structure with an atomically flat surface of a desired size and shape is achieved.

BRIEF DESCRIPTION OF THE DRAWINGS

FIG. 14 is composed of FIGS. 14(A) and 14(B), which illustrate material from the substrate being removed so as to form the second growth surface of the present invention.

FIG. 15 is composed of FIGS. 15(A) and 15(B), which illustrate an ongoing evolution of the cantilevered web growth into the third growth surface.

FIG. 16 is composed of FIGS. 16(A), 16(B), and 16(C), which illustrate the web growth associated with the present invention in its completed stage and providing a continuous film free of discontinuities.

FIG. 17 is composed of FIGS. 17(A), 17(B), and 17(C) accumulatively providing a schematic of a cross-section of a SiC mesa and, wherein

DETAILED DESCRIPTION OF THE PREFERRED EMBODIMENT

Figure 1:
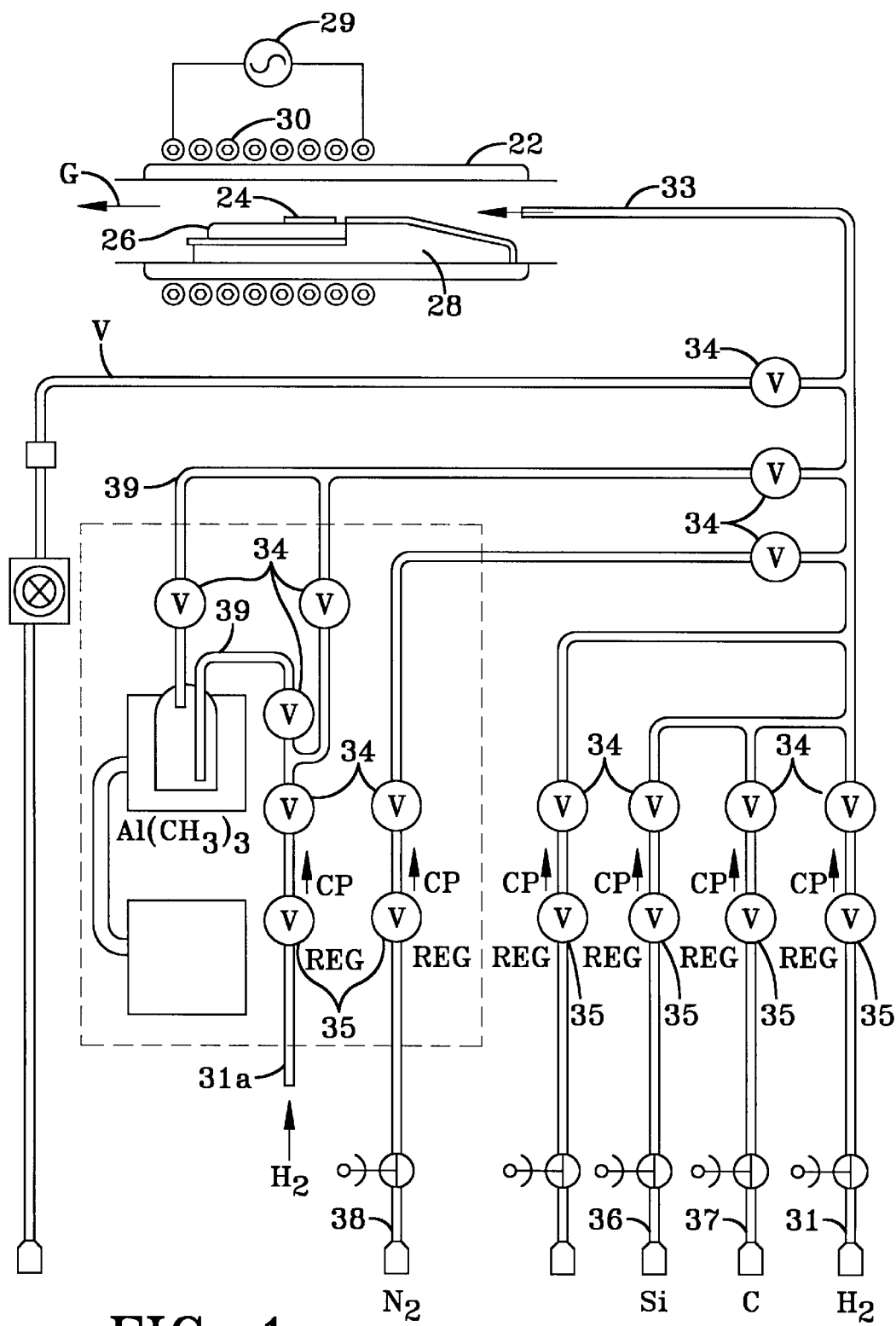
FIG. 1 is a schematic drawing of a CVD system employed for the growing of crystal films in accordance with the present invention.

Referring now to the drawings, wherein the showings are for the purpose of illustrating preferred embodiments of the invention only and not for the purpose of limiting the same, the invention describes an improved chemical vapor deposition (CVD) method for obtaining improved quality of the grown crystal films. Prior art chemical vapor deposition (CVD) processes are disclosed in U.S. Pat. Nos. 5,463,978, 5,915,194, and 6,165,874 all of which are herein, incorporated by reference. Other growth processes, e.g., sublimation, vapor phase epitaxy, molecular beam epitaxy, and others may be used in the practice of the present invention. While the method of the present invention may be applied to many different crystals contemplated by the present invention, the method will primarily be specifically described with respect to the growing of silicon carbide (SiC) crystals. The improved CVD method includes pretreating a substrate, heating the substrate in a reaction chamber introducing a carrier gas, vaporizing the crystal growing compounds, introducing the vaporized compounds in the reaction chamber via the carrier gas and maintaining proper energy levels and material flow rates in the reaction chamber for a sufficient time to grow a crystal film having a desired smooth surface morphology, a uniform thickness, a low-defect density and a controlled impurity profile. The crystals may be intentionally doped to form n-type conductivity and/or p-type conductivity crystals. The improved CVD crystal growing method provides for atomically flat basal-plane surfaces grown by step-flow growth (without two-dimensional (2D) nucleation and with the benefits of the present invention to be described) over a wide range of conditions provided the SiC substrate surface is properly prepared.

The method of the invention can be carried out with a conventional chemical vapor deposition (CVD) system similar to that used in Si, SiC and GaAs semiconductor technology. The gases used in a SiC CVD system are hydrogen (used as a carrier gas) silane (used as a source of Si) propane (used as a source of C). HCl (used for cleaning and etching the substrate surface) nitrogen (N2) (used as a n-type dopant) and trimethyl aluminum (TMA) (used as a p-type dopant). Other gases may be used as the Si or C source or used to dope the crystal. Gases other than hydrogen and various gas mixtures can also be used as a carrier gas. If organic compounds are used as the Si and C sources, the process is commonly referred to as metal-organic vapor phase epitaxy (MOVPE). Any CVD system that can deliver these gases to a suitable reaction chamber at the proper flow rates under high purity conditions and at the proper substrate temperatures can be used for the method of the present invention.

Referring now to FIG. 1, there is shown a schematic, partial view of one suitable CVD reaction system for carrying out the process of the invention. The CVD reaction system includes a reaction chamber 22 comprised of a double-walled quartz tube such that the inner quartz tube can be water-cooled. A SiC substrate 24 is supported by a SiC coated graphite susceptor 26, which, in turn, is supported by quartz support 28. To produce the desired temperature of the surface of substrate 24, a radio-frequency (RF) induction coil 30 is disposed around reaction chamber 22. Induction coil 30 is powered by frequency generator 29. The RF field produced by induction coil 30 heats substrate 24 via susceptor 26 to the desired temperature of the susceptor 26. When SiC film layers are grown, substrate 24 is preferably a SiC substrate. The gaseous crystal compounds are introduced into reaction chamber 22 by primary line 33. Primary line 33 is located at one end of reaction chamber 22 and directs the gases to flow in direction G across substrate 24 and out the opposite end of chamber 22. The various gaseous crystal compounds are connected to primary line 33 and the gas flow is regulated by valves 34 and regulators 35 connected to each gas line. Line 36 is the silicon gas line that controls the silane flow into primary line 33, and line 37 is the carbon gas line that controls the propane flow into primary line 33. The dopants are introduced into primary line 33 by line 38 and line 39. Line 38 is the n-type dopant line and preferably controls the nitrogen gas ($N_2$) flow rate.

Line 39 is the p-type dopant line and preferably controls the trimethyl aluminum (TMA) flow rate. Carrier gas line 31 carries all the gaseous crystal compounds and dopants through primary line 33 and into reaction chamber 22. The carrier gas is preferably a gas such a hydrogen gas ($H_2$). Carrier gas line 31 is partially diverted into line 31a to supply line 39 so that the carrier gas can be bubbled through the liquid TMA when p-type aluminum doping is desired. A vacuum line (V) connected to a vacuum can be connected to primary line 33 to evacuate reaction chamber 22 of gases.

SiC substrate 24 is prepared by slicing a section from a SiC boule. Substrate 24 is cut such that the surface is slightly mis-oriented relative to the basal plane by tilt angle of less than 1°, in a manner more fully described in U.S. Pat. No. 5,915,194. The SiC substrate 24 is chosen to be a single crystal substrate material which exhibits a property that the material contains at least one growth plane orientation whereby under selected growth conditions, to be further described, the growth rate due to step-flow growth is greater than at least one hundred (100) times the growth rate due to growth involving two-dimensional nucleation, also to be further described. Further, the single-crystal substrate 24 is selected from the group polytype compositions consisting of 6H-SiC, 4H-SiC, 15R-SiC, 2H-GaN, and 2H-AlN. The tilt direction of the substrate 24 is sometimes selected so as to produce the optimum growth rates and quality of the SiC epitaxial films grown on substrate 24. The surface of substrate 24 is polished preferably on one surface with a diamond paste and/or a final polish using a chemical-mechanical polishing technique.

Substrate 24 is further prepared by creating boundaries or trenches on the face of substrate 24, which form growth regions called mesas. Trenches defining growth region boundaries are preferably cut by physical means such as a photolithographic patterned reactive ion etching. However, boundaries may be formed by other physical means such as photolithography, laser etching, and/or photochemical or electrochemical etching processes. The width of the trenches may be as small as 10 micrometers, but larger widths that enable more optimal growth boundary shapes can also be used. The depth of trenches is preferably about 50 micrometers, but may be deeper or shallower.

The present invention in one embodiment produces single crystal structures with cantilever web features on a single-crystal substrate. The method first chooses the single-crystal substrate and then prepares a planar first surface on the substrate that is parallel within a predetermined angle relative to a selected crystal plane, which is preferably the basal plane as previously described. The present invention then removes material in the first surface area which may be further described with reference to FIG. 2.

Figure 2:
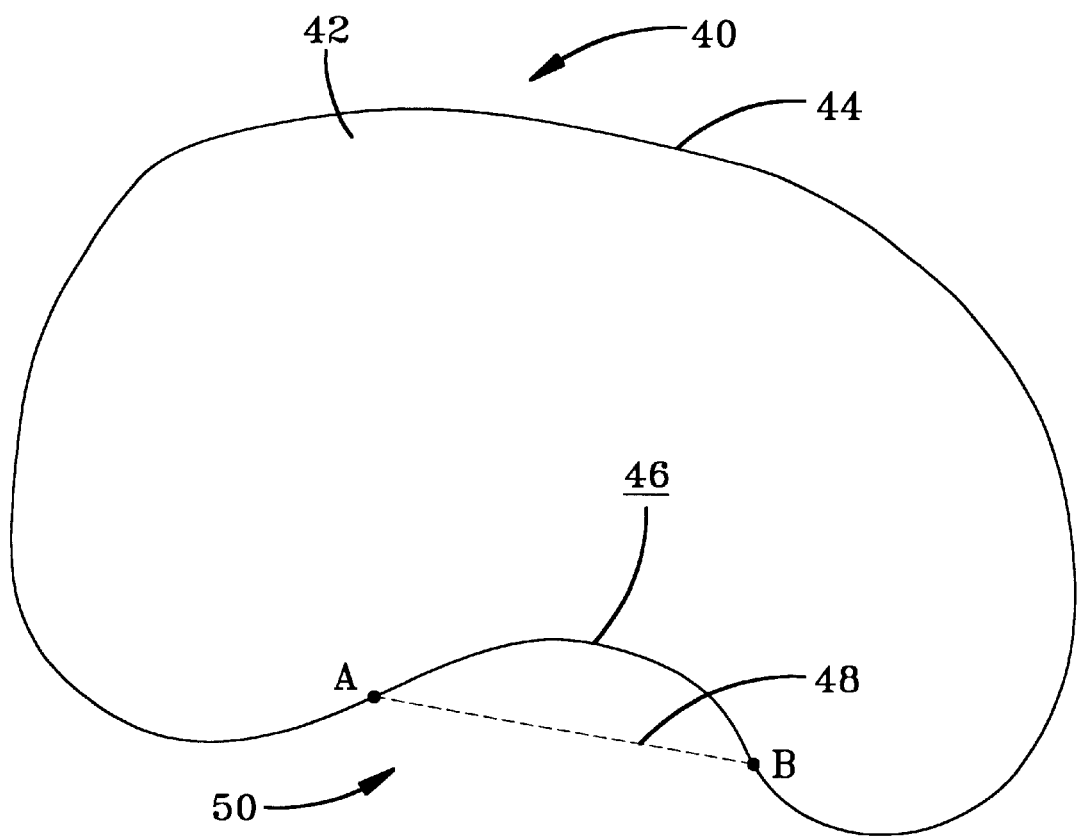
FIG. 2 schematically illustrates the selection of a surface having a boundary that includes a concave portion and that allows for cantilevered web growth, which is of particular importance to one embodiment of the invention.

The first growth surface is generally identified in FIG. 2 by reference number 40. Material is removed from this first growth surface so as to define at least one second selected growth surface 42 defined by a boundary 44, wherein the boundary 44 has at least one concave border 46. The concave portion 46 has a line segment 48 which connects points A and B on the boundary 44. The region shown by line segment 48 inward to the concave border 46 defines a selected third growth area which is generally indicated by reference number 50.

With reference to FIG. 2, the planar closed curve forming the boundary 44 has a property that confines two points A and B on the boundary 44, such that a straight line segment 48 beginning at one of the two points A or B and ending at the other point B or A resides outside of the second growth surface 42. Any portion of the boundary 44 for which the above condition is satisfied is defined herein as a concave portion 46 of the boundary 44. The third selected growth area 50 may have a plurality of desired sizes and shapes, some of which may be further described with reference to FIG. 3. The points A and B can exist anywhere along the boundary 44.

Figure 3:
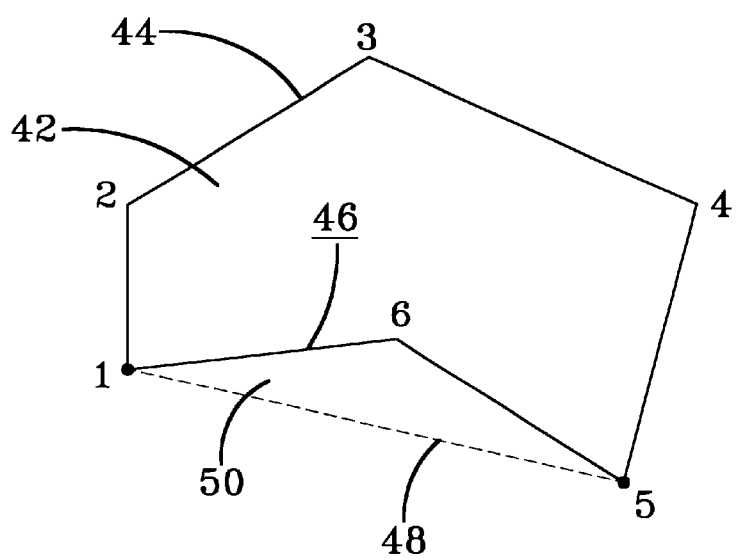
FIG. 3 illustrates a six-sided polygon serving as the selected growth surface for providing cantilevered web growth, which is of particular importance to one embodiment of the present invention.

FIG. 3 illustrates a third selected separate growth area 50 defined by a boundary 44, wherein the boundary 44 has at least one concave border 46. More particularly, FIG. 3 illustrates a six-sided polygon having points 1–6, with line segment 48 interconnecting points 1 and 5, and with the concave portion 46 of the boundary 44 located between the points 1 and 5. Further, although a 6-sided polygon is shown in FIG. 3 to define the second growth surface 42, in which the third growth area 50 is shown, a four (4) or more sided polygon may be used in the practice of the present invention. Further, the second growth surface 42 may comprise an array of growth surfaces.

Figure 4:
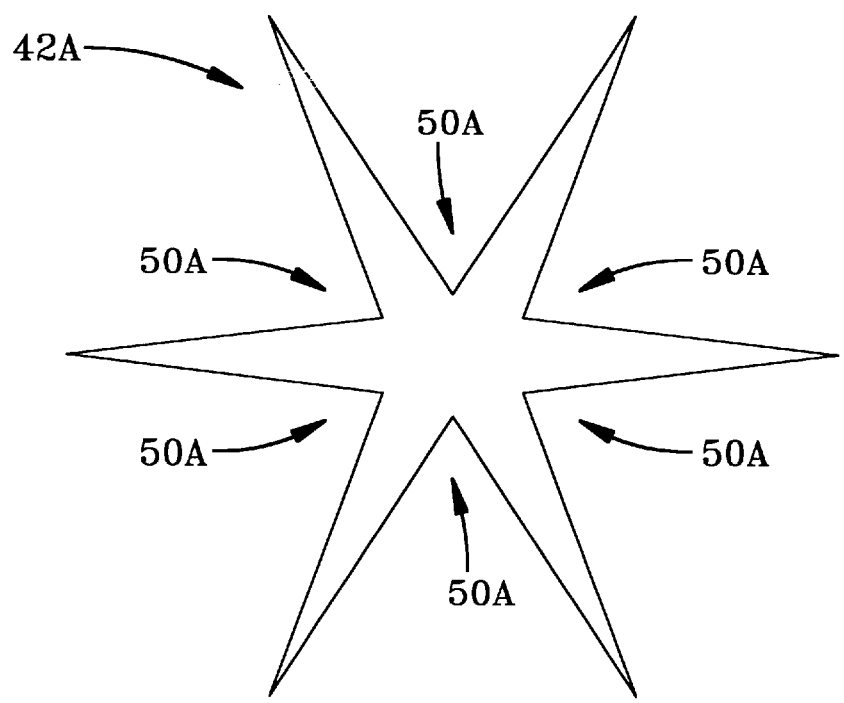
FIG. 4 illustrates a six-branch star arrangement serving as a second growth surface which, in turn, provides for multiple third growth areas particularly suited for cantilevered web growth.
Figure 5:
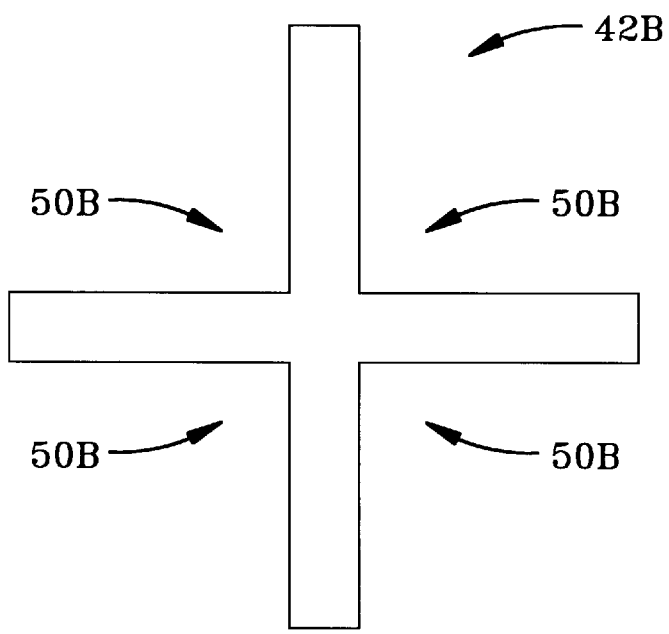
FIG. 5 is a cross arrangement serving as the second growth surface which provides for multiple third growth areas particularly suited for cantilevered web growth.
Figure 6:
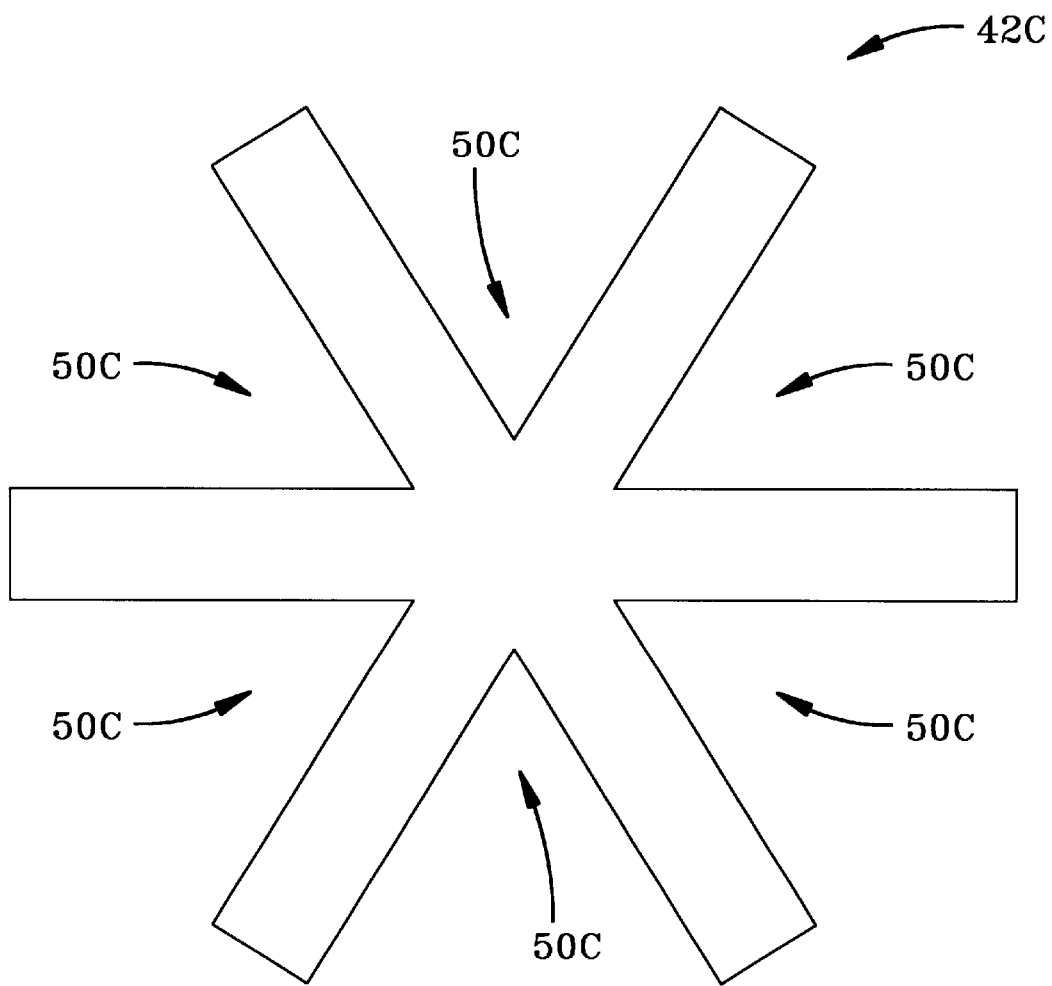
FIG. 6 illustrates an arrangement having six intersecting branches forming the second growth surface which provides for multiple third growth areas particularly suited for cantilevered web growth of importance to the present invention.

FIG. 4 illustrates a second growth surface 42A having a six-branch star shape defining six distinct third growth areas 50A. FIG. 5 illustrates a second growth surface 42B having a cross-shape defining four distinct third growth areas 50B. FIG. 6 illustrates a second growth surface 42C having a six branch intersecting arrangement defining six distinct third growth areas 50C. FIG. 4 and FIG. 6 differ in that FIG. 4 uses a triangular branch shape, while FIG. 6 uses a rectangular branch shape.

The selected boundary shape 44 is preferably formed by joining selected simple branch shapes to the form a concave boundary 46 that promotes web growth. The branch shapes may be selected to join in one or more of the following configurations that provide one or more concave boundaries 46 that promote web growth; the V-shape; U-shape; multiple joined V-shape; multiple joined U-shape and a tree, along with combinations thereof. The selected branch shapes and boundary shapes may be further described with references to FIGS. 7, 9, 10, 11, and 12.

Figure 7:
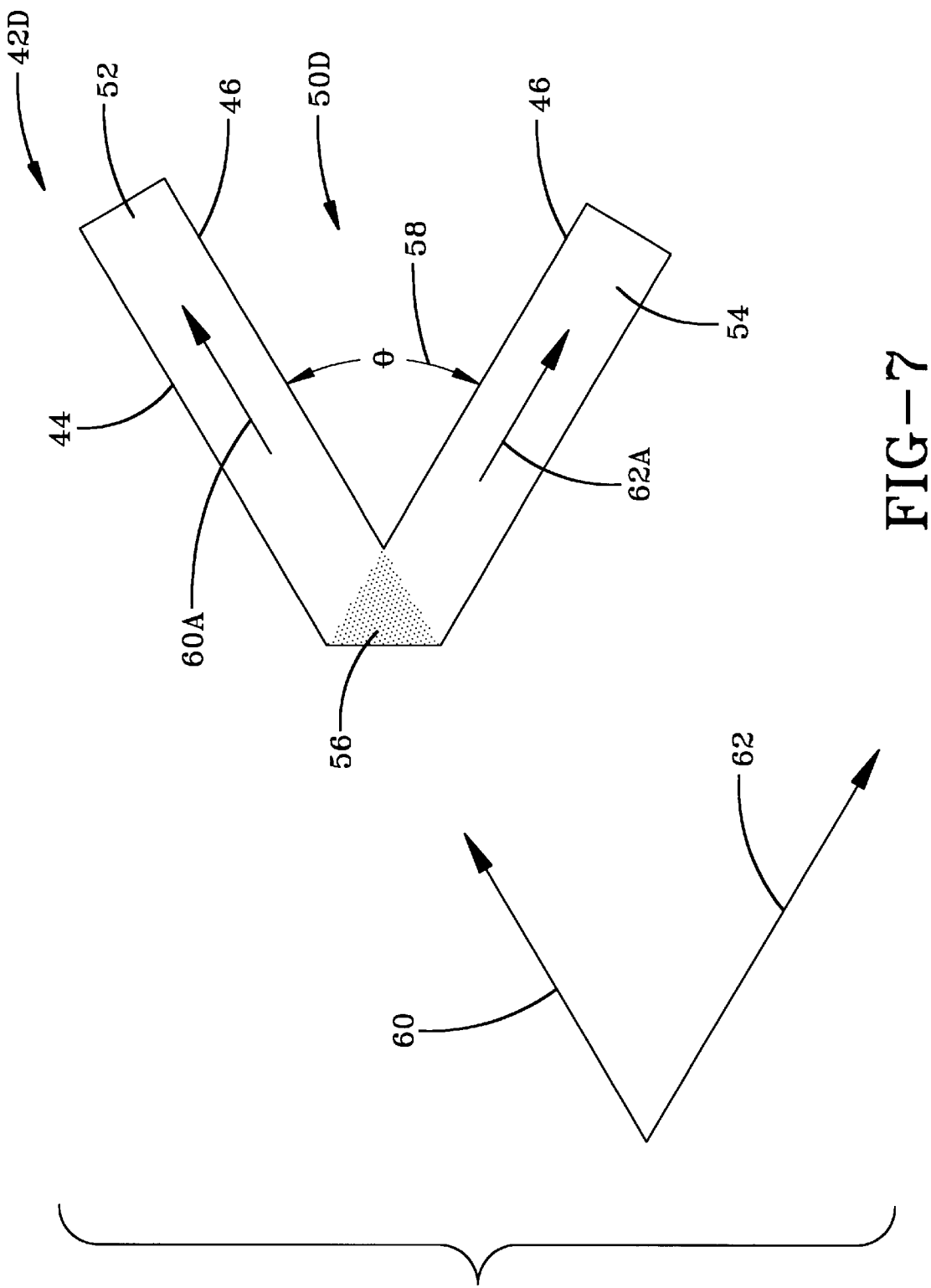
FIG. 7 illustrates a simple V configuration serving as the second growth surface which provides for a third growth area particularly suited to provide cantilevered web growth of importance to the present invention.

FIG. 7 illustrates a second growth surface 42D as having a simple V-shape configuration consisting of two simple rectangular shaped branches 52 and 54 that are joined together at a root region 56. The two simple branches 52 and 54 are interconnected to form the concave portion 46 of the boundary 44 and are oriented (or angled) from each other by an angle θ between 0 degrees and 179 degrees. The branches 52 and 54 need not be the same lengths. Further, the branches 52 and 54 preferably have a length dimension that is greater than their width dimension. More particularly, the shape of the branches 52 and 54 are preferably not to be selected so as to be equilateral (i.e., square), and are preferably selected so as to be longer than they are wider for both rectangular and triangular arrangements. Further, the branches 52 and 54 are preferably oriented so that their lengths lie in the crystal vertex directions, to be further described with reference to FIG. 8, as respectively indicated by directional arrows 60 and 62 and arrows 60A and 62A of branches 52 and 54 respectively. This orientation advantageously promotes a fast growth of web-structures to form crystal facets. In another embodiment, branches 52 and 54 are preferably oriented so that their lengths lie in the crystal facet direction, to be further described with reference to FIG. 8. Further, the root region 56 of FIG. 7, as well as the other root regions to be described, is selected so as to contain the highest initial seed plane, to be further described hereinafter with reference to FIG. 17(A), of the second selected growth surface 42D. The selection of the root region 56 having the highest initial crystal seed plane enables step-flow to proceed in one general direction and to most quickly realize atomically flat surfaces that maximize further growth rate of the web structure. The atomically flat surfaces are to be further described hereinafter. The crystal vertex direction as well as facet direction related to all of the second growth surfaces of the present invention may be further described with reference to FIG. 8.

Figure 8:
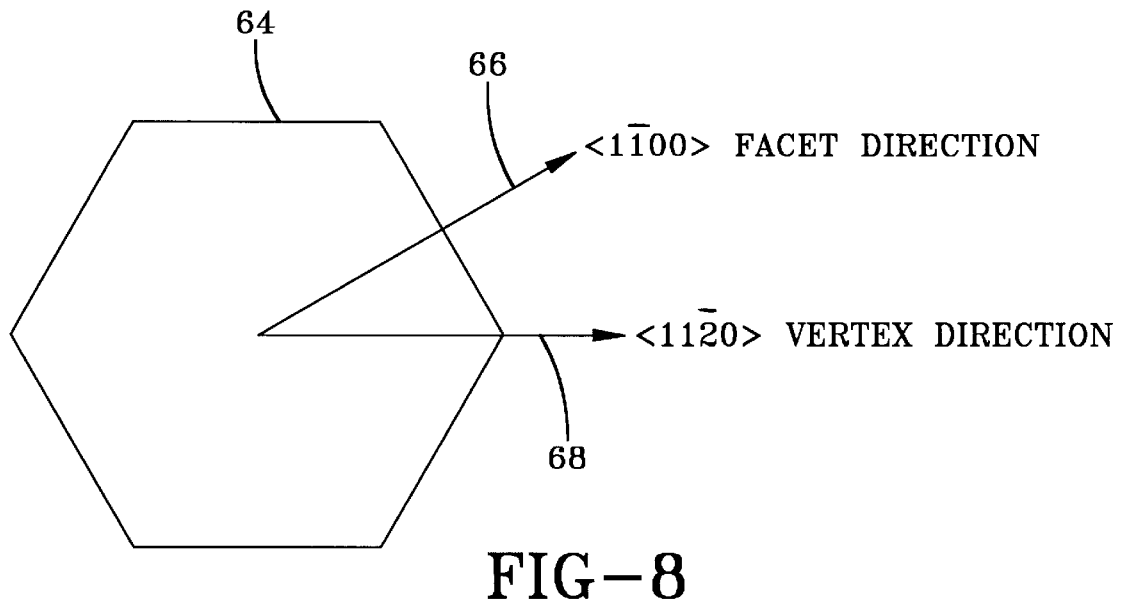
FIG. 8 illustrates the facet and vertex directions for an epitaxial hexagonal SiC composition.

FIG. 8 schematically depicts directions for a crystal with a hexagonal structure, such as 6H-SiC that is hexagonally shaped with 6-fold symmetry. The crystal directions and Miller indices are all well known to those skilled in the art. Although only two directions are explicitly illustrated in FIG. 8, there are six equivalent facet directions 66 and six equivalent vertex directions 68 (both known in the art), where the facet direction 66 is shown as <1$\bar{1}$00> and the vertex direction 68 is shown as <11$\bar{2}$0>. Further, second growth surfaces having selected branch shapes may be further described with reference to FIG. 9.

Figure 9:
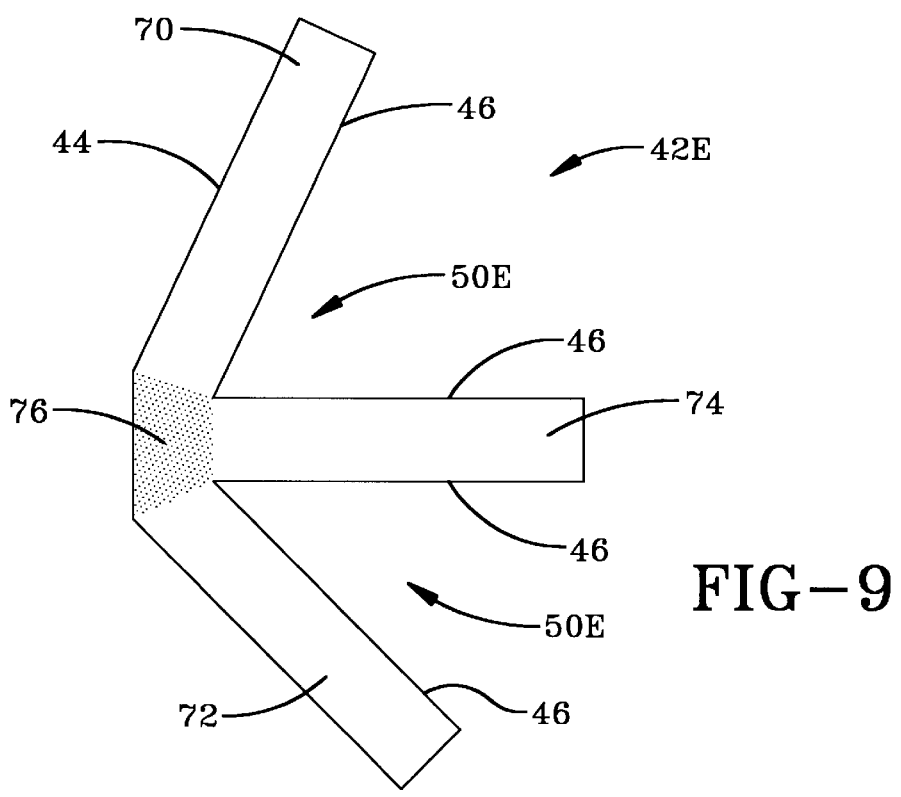
FIG. 9 illustrates a multiple V-shape configuration serving as the second growth surface which provides for multiple third growth areas particularly suited to provide the cantilevered web growth of importance to the present invention.

FIG. 9 illustrates a second growth surface 42E having a multiple V-shape configuration that is obtained by joining three branches 70, 72, and 74 at a common root region 76. The root region 76 is the region from which the branches 70, 72, and 74 originate. As shown in FIG. 9, each of the branches 70, 72, and 74 has an edge that provides for the concave border portions 46 which, in turn, provide for multiple third growth areas 50E as shown in FIG. 9.

Figure 10:
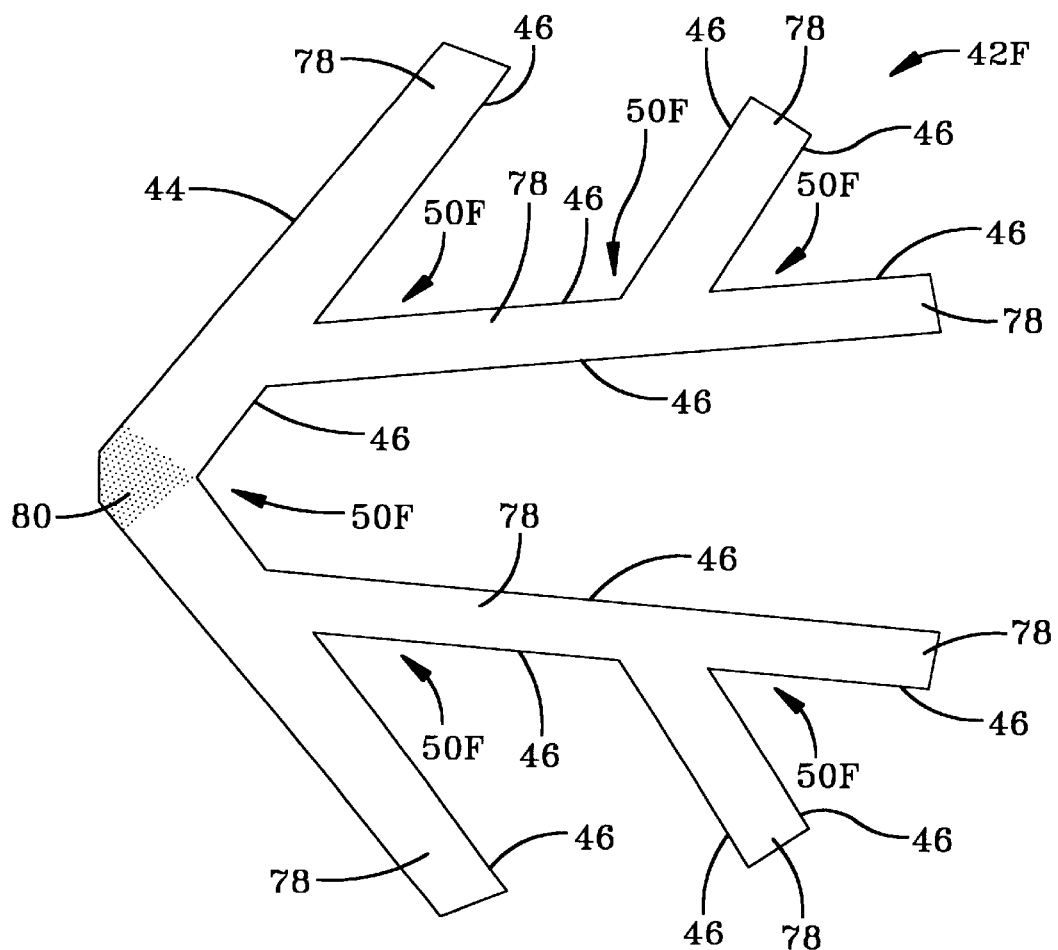
FIG. 10 illustrates a tree configuration serving as the second growth surface which provides for multiple third growth areas particularly suited to provide the cantilevered web growth of importance to the present invention.

FIG. 10 illustrates a second growth surface 42F having a tree configuration comprised of multiple joined V-shapes made up of a plurality of branches 78. The second growth surface 42F has a root region 80 from which the structure of the branches 78 originates. As seen in FIG. 10, the concave portions 46 are formed by the plurality of branches 78 so as to provide for multiple third growth areas 50F.

Figure 11:
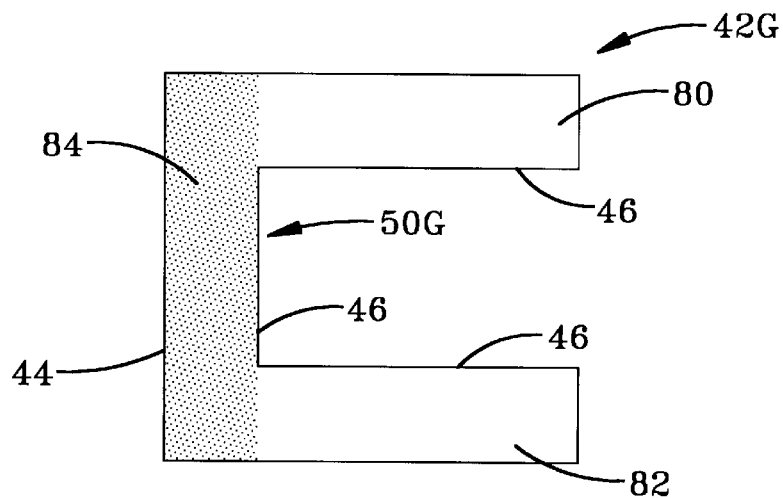
FIG. 11 illustrates a simple U-shape configuration serving as the second growth surface which provides for a third growth area particularly suited to provide cantilevered web growth of importance to the present invention.

FIG. 11 illustrates a second growth surface 42G having a simple U-shape configuration and formed from two branches 80 and 82 having a root region 84 that connects the two branches 80 and 82.

Figure 12:
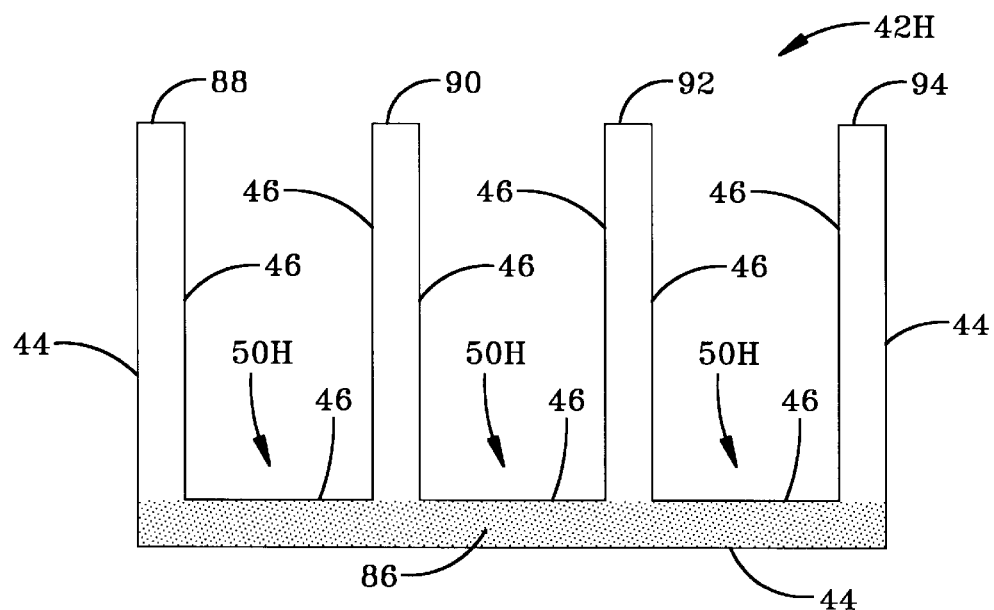
FIG. 12 illustrates a multiple U-shaped configuration serving as the second growth surface which provides for multiple third growth area s particularly suited to provide the cantilevered web growth of importance to the present invention.

FIG. 12 illustrates a multiple U-shaped configuration resembling that of a comb and serving as a second growth surface 42H which provides for multiple third growth areas 50H. The second growth surface 42H has a root region 86 that connects the branches 88, 90, 92 and 94. All of the second growth surfaces 42, 42A, 42B, 42C, 42D, 42E, 42F, 42G, and 42H are formed from a substrate in a manner that may be further described with reference to FIGS. 13–18.

Figures 13A, 13B:
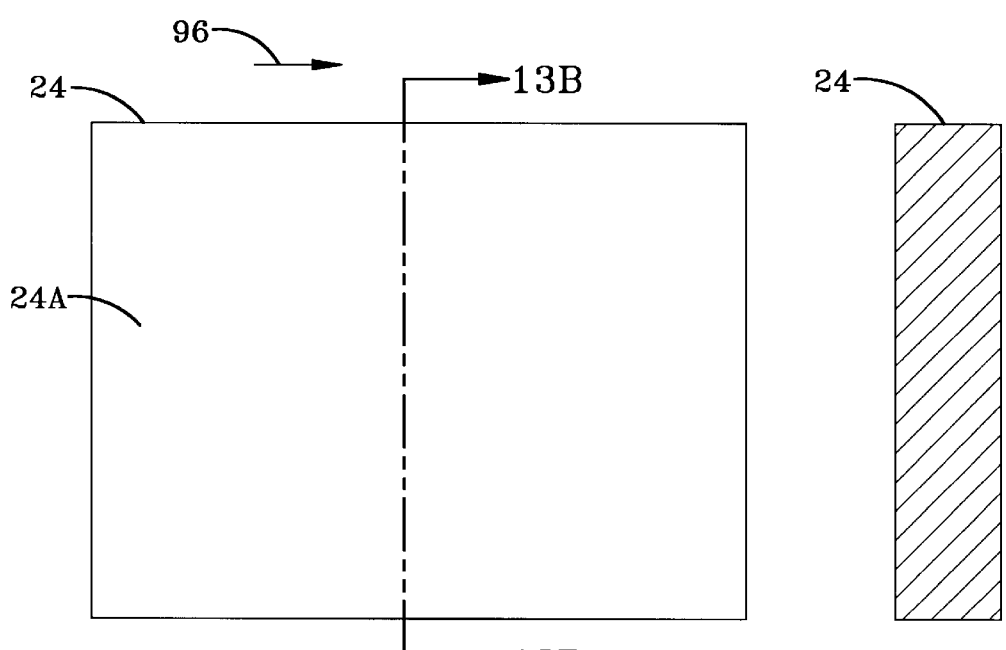
FIG. 13 is composed of FIGS. 13(A) and 13(B) which illustrate the initial condition of the method of the present invention starting from a commercially available substrate and indicating the exact down-step (step-flow growth) direction.

FIG. 13 is composed of FIGS. 13(A) and 13(B), wherein FIG. 13(A) illustrates a portion of a substrate 24 with a plane surface 24(A) in its initial condition associated with the present invention, that is, starting as a commercially available substrate 24. FIG. 13(A) illustrates by the use of a directional arrow 96 to indicate the exact down-step (step-flow growth) direction. Preferably, the branches of the second growth surface flow toward the general down-step directions which are within, plus or minus, ninety (90) degrees of the exact down-step direction 96 in a manner as will be described hereinafter with reference to FIG. 17. FIG. 13(B) shows a cross-section of the substrate 24 taken along line 13(B)—13(B) of FIG. 13(A).

The orientation of the branches flowing in a general down-step direction is desired because it provides a step-flow in one general direction throughout the growth so as to more quickly obtain atomically flat surfaces that maximize further growth rate of web structure. The growth of the web structure, which is of particular importance to the present invention, may be further described with reference to FIGS. 14–18.

FIG. 14 is composed of FIGS. 14(A) and 14(B). FIG. 14(A) illustrates a substrate 24 having a surface 24B from which material is removed to form a selected second growth surface, such as 42, comprised of two branches 98 and 100 that are joined together at a root region 102. FIG. 14(A), as well as FIGS. 15(A) and 16(A) to be described, illustrates directional arrows 60 and 62 associated with the respective branches shown therein and indicative of the crystal vertex directions previously described with reference to FIG. 8. A cross-section of the branches 98 and 100, such as branch 98, is to be further described hereinafter with reference to FIG. 18 which is a view taken along line 18—18 of FIG. 14(A). The removal of the material forms raised portions, such as branches 98 and 100, which may be shown with reference to FIG. 14(B) which a view taken along line 14(B)—14(B) of FIG. 14(A).

As seen in FIG. 14(B) the branches 98 and 100 are raised relative to the remaining substrate 24. The second growth surfaces 42, 42D, 42E, 42F, 42G, and 42H have branches that flow from the root regions 102, 56, 76, 80, 84 and 86, respectively, in the general down-step direction. The cantilevered web growth of the present invention may be further described with reference to FIG. 15.

FIG. 15 is composed of FIGS. 15(A) and 15(B), wherein FIG. 15A illustrates the structure part way through the step-flow growth portion of the process. FIG. 15(A) illustrates branches 98 and 100 and root region 102 previously described with reference to FIG. 14. The branches 98 and 100 have growing cantilevers 98A, 100A, and 104.

As seen in FIG. 15(A), a cantilevered web growth region 104, shown in cross hatch, is being formed and partially provides third growth surface 50. It should be noted as used herein, when the cantilevered web growth is actually occurring the reference number 50 is used to signify a forming third growth surface rather than a third growth area. The extent of the cantilevered web growth 104 may be further described with reference to FIG. 15(B), which is a view taken along line 15(B)—15(B) of FIG. 15(A).

As seen in FIG. 15(B), the non-concave edges 98A and 100A each have a cantilevered lip formed from lateral growth, but more importantly, the cantilevered web growth 104 along concave edges exceeds the lateral growth of the non-concave edges 98A and 100A, but has not yet fully spanned the concave region formed by branches 98 and 100. The advantageous combination of two known growth mechanisms is believed responsible for the observed more rapid extension of web cantilevers 104 along the concave edges relative to the cantilevers along the non-concave edges 98A and 100A. It is well known by those skilled in the art that growth reactants diffusing around the surface of a crystal prefer to incorporate into internal corners and steps of a growing crystal. This makes the concave vertex of the growing cantilever 104 a preferential site for incorporation of reactant into the crystal, which in turn enables faster growth than on the non-concave edges 98A and 100A. It is also well known by those skilled in the art that under selected growth conditions, growing crystals exhibit faceting phenomena, wherein the crystal prefers to grow in a given shape according to its crystal structure. With the selected pattern and orientation shown in FIG. 15(A) described previously, the internal portion of the cantilevered web will want to grow rapidly to form a <1$\bar{1}$00> facet that spans the top of the V, as completely achieved in FIG. 16(A), to be described. The completed spanning of branches 98 and 100 may be further described with reference to FIG. 16.

FIG. 16 is composed of FIGS. 16(A), 16(B), and 16(C) with FIGS. 16(A) and 16(B) respectively similar to FIGS.

15(A) and 15(B). FIG. 16(A) is different than FIG. 15(A) in that it shows that the cantilevered web growth 104 has completely spanned between the branches 98 and 100. The thickness of the completed web growth 104 may be further described with reference to FIG. 16(B), which is a view taken along the line 16(B)—16(B) of FIG. 16(A).

As seen in FIG. 16(B), the web cantilevered growth 94 has a relatively uniform cantilevered thickness 104A, and completely spans between the branches 98 and 100 to form the completed third growth surface 50.

The thickness 104A extending between branches 98 and 100 is further illustrated in FIG. 16(C) which is a view taken along line 16(C)—16(C) of FIG. 16(A). As seen in FIG. 16(C), the cantilevered thickness extends from the edge of the root region 102 outward. The branch 98 (and also branch 100 not shown) has a further edge 98B having lateral growth similar to that of edge 98A of FIG. 16(B). The cross-section of branches such as branch 98 is to be further described with reference to FIG. 18 which is a view taken along line 18-18 of FIG. 16(A), as well as that of FIG. 14(A) previously mentioned.

It should now be appreciated that the practice of the present invention provides a method for producing single crystal structures with cantilevered web features on a single-crystal substrate. The practice of the present invention may be further described with reference to an example used in the practice of the present invention.

The method of the present invention, in one embodiment, first chooses a single-crystal substrate material which exhibits the property that the material contains at least one growth plane orientation whereby under selected conditions, the growth rate due to the step-flow growth is greater than at least (100) times the growth rate to growth involving two (2) dimensional nucleation.

Further, the single-crystal is selected from crystal materials previously described. For the example used in the practice of the present invention, a crystal of 4H-SiC was selected. The method further comprises preparing a planar first growth surface of the substrate so as to be parallel to a predetermined angle relative (to be further described hereinafter with reference to FIGS. 17(A) and 18) to a selected crystal plane of the substrate. The method further continues by removing first growth surface of the substrate in a manner as previously described with reference to FIG. 14(A), so as to define at least one selected separate second growth surface, such as 42 of FIG. 14(A) that is defined by a boundary 44, such as that formed by the branches 98 and 100 of FIG. 14(A). The boundary has at least one concave border 46, such as that shown in FIG. 14(A), which is used for forming the third growth surface 50 such as that shown in FIG. 16(A).

The substrate 24 is preferably treated so as to remove any removable sources of unwanted crystal nucleation and any other removable sources of steps. It is preferred that the second growth surface 42 and its boundary 44 be selected so as to define a numerical area that is less than 10 times the mathematical inverse of the density of the non-removable step sources contained in the substrate 24. An example of non-removable defects in a second growth surface would be screw dislocations in 4H-SiC wafers as described in the previously mentioned technical article of Powell, Neudeck et al. The average screw density in a typical SiC substrate is approximately 10,000 per square centimeter. Therefore, preferably in such a case, the area of the second growth surface would be selected to be less than 10 divided by 10,000 which equals $10^{-3}$ cm$^2$.

The branches 98 and 100 are oriented in a preferred direction in a manner as previously described with reference to directions 60 and 62 of FIG. 7. Each branch 98 and 100 runs parallel to a <11$\overline{2}$0> vertex direction for 4H-SiC and both branches 98 and 100 flow from the 102 root toward the general down-step direction. The overall orientation of the second growth surface 42 is provided so that the root, such as root 102 of FIG. 14(A), serves as the vertex of the arranged branches 98 and 100 and contains the top crystal seed plane 106 in FIG. 17(A), to be further described, allowing the branches 98 and 100 to grow toward the general down-step direction.

A homoepitaxial film, such as 4H-SiC grows in a cantilevered web structure in a manner as previously described with reference to FIGS. 16(A) and 16(B), and more preferably in a atomically flat cantilevered web structure manner. The cantilevered web structure initiates at the inside concave corners of the V, such as, that defined by branches 98 and 100, and upon completion in FIG. 16(A) conforms to <1$\overline{1}$00> facet formation, previously described with reference to FIG. 8. The deposition continues until the third selected growth surface 50 has achieved its desired size and shape.

It should now be appreciated that the practice of the present invention provides a method that yields a third selected growth surface having a cantilevered web feature growth. More particularly, the third growth surface is unlike prior art in that it is a continuous composition and does not possess any discontinuities arising from poorly controlled coalescence, which, as discussed in the "Background" section causes undesirable resistance losses. The fact that the cantilevered web growth originates from a continuous mesa boundary that acts as the seed eliminates the need of prior art ELO to coalesce separate growth islands growing islands growing together from separate adjacent seeds. Instead, the present invention provides for well-ordered enlargement of the continuous top surface region of a single mesa "seed" in a progressive manner through cantilevered web growth that alleviates coalescence difficulties of prior art. Furthermore, by completely arresting vertical growth after the top surface becomes atomically flat, the present invention maximizes desired high lateral growth rate of cantilevered web features unlike prior art where vertical growth takes place at the same time as lateral growth. Also, the resulting surface is atomically flat which was not possible with prior art ELO processes. Finally, because the present invention relies on homoepitaxial growth, new defects are not nucleated directly above the seed as seen in prior art heteroepitaxial ELO processes.

Figure 17A:
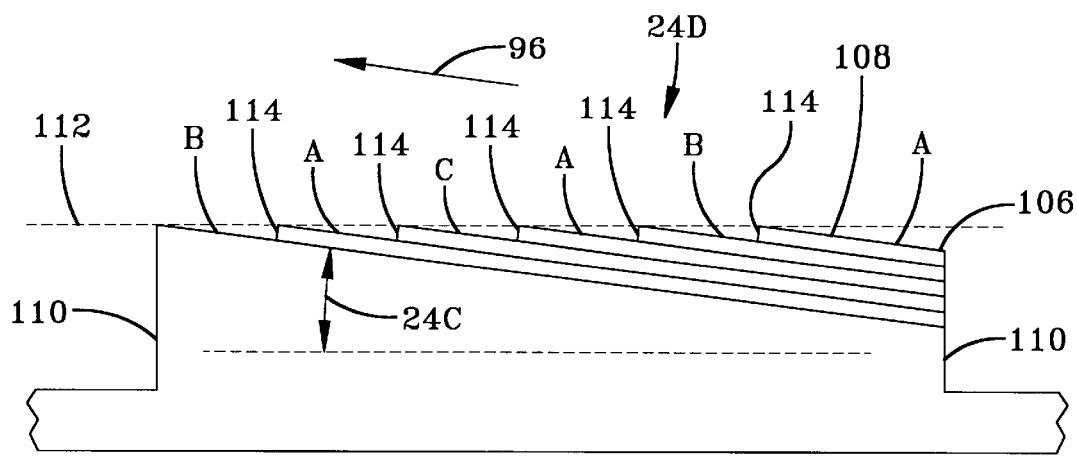
FIG. 17(A) illustrates surface steps on the top surface of a mesa.

The present invention also provides for atomically flat surfaces and which may be further described with reference to FIG. 17, which is composed of FIGS. 17(A), 17(B), and 17(C). FIG. 17(A) shows in cross section, a typical "on-axis" SiC wafer 24D that has, in a manner already described, a polished surface and that is oriented within a small tilt angle 24C relative to the crystal (0001) plane (also called the basal plane) identified by reference number 108 in FIG. 17(A). The surface has been etched in a manner as hereinbefore described to define the mesa with edges 110 to be described.

Each SiC crystal is formed by a specific stacking sequence of double layers of Si and C atoms. The SiC crystal structure is more fully described in U.S. Pat. Nos. 5,915,194 and 6,165,874. Each of these layers is a basal plane 108. Hereinafter, the top most double layer of a SiC crystal surface within an etched mesa with edges 110 is termed the initial seed plane 106 shown in FIG. 17(A). The SiC mesa 24D has an initial top surface 112. Because of the unintentional tilt of the polished surface with respect to the basal plane 108, surface steps 114 are formed at the surface without the benefits of the present invention.

Figure 17B:
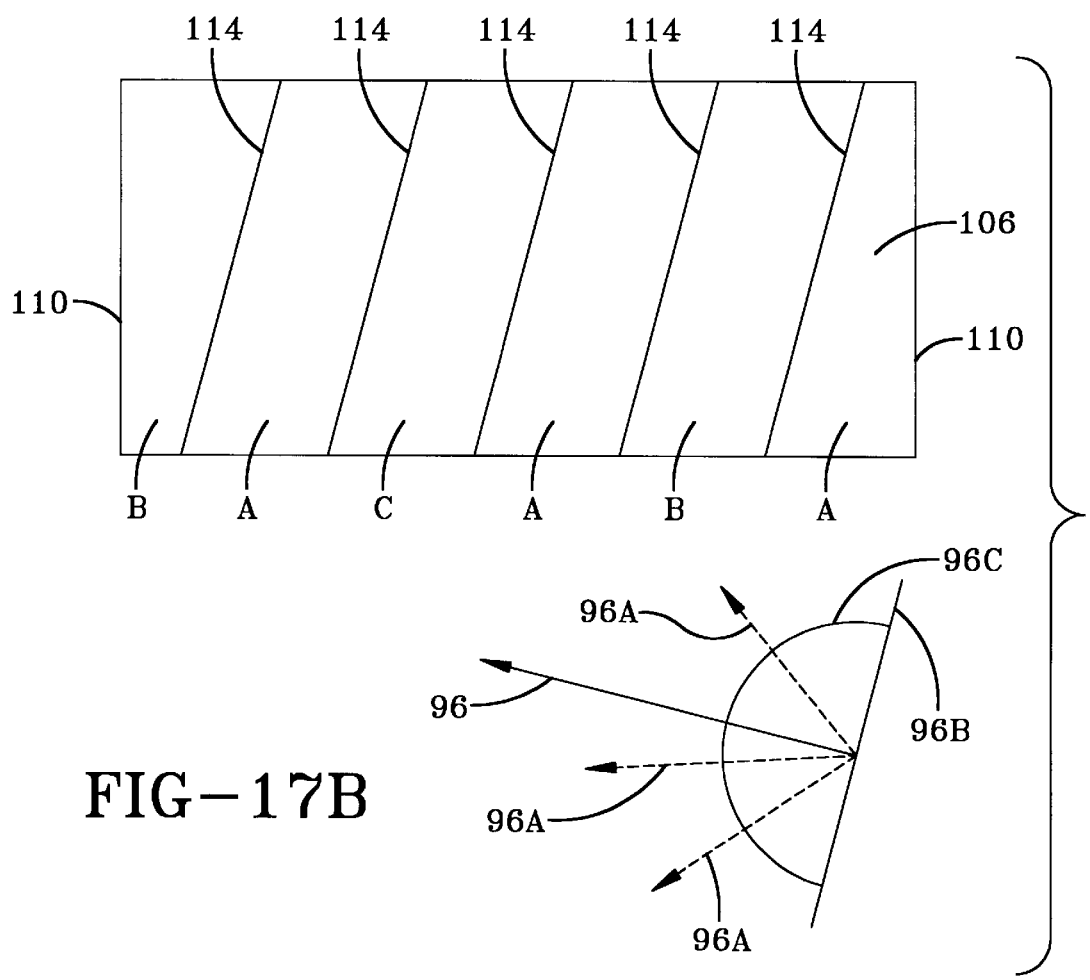
FIG. 17(B) is a top view of the surface of FIG. 17(A)
Figure 17C:
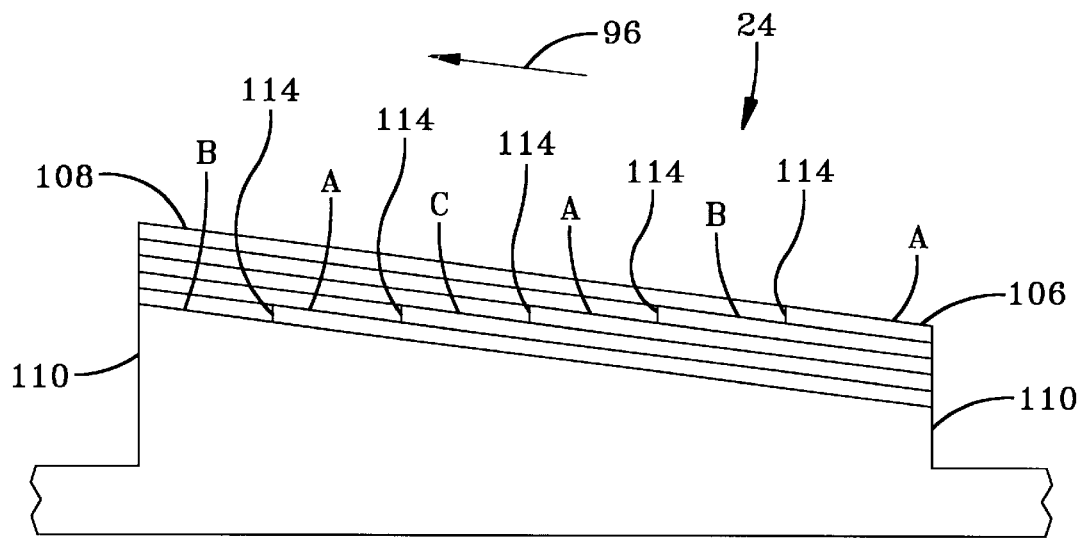
FIG. 17(C) illustrates the elimination of the surface steps by step-flow epitaxial growth.

FIG. 17 illustrates a 4H stacking order A,B,A,C, however, FIG. 17 is equally applicable to a 6H stacking order A,B, C,A,C,B and other stacking orders, all of which are plagued with the surface steps 114. The SIC crystal growth shown in FIG. 17, is a lateral growth of the surface 108 in a direction indicated by directional arrow 96 which is also the exact down-step growth direction previously mentioned with reference to FIGS. 14(A) and 16(A), and which may be further described wit h reference to FIG. 17(B).

FIG. 17(B) is a top view of FIG. 17(A) and primarily illustrates the exact down-step direction 96 an d some possible general down-step directions 96A shown in phantom. The exact down-step direction 96 is shown in FIG. 17(B) as being referenced to plane 96B which is parallel to the initial steps 114 prior to expitaxial growth. The general down-step direction 96A resides within an arc 96C of plus or minus 90 degrees (in the planar mesa 24D top surface) of the exact down-step direction 96. The exact down-step direction 96 moves downward in a perpendicular manner relative to plane 96B and provides for the most rapid growth of the deposition, whereas the general down-step directions 96A provide for less rapid growth. FIG. 17(C) is quite similar to FIG. 17(A), but illustrates the elimination of the surface steps 114 following sufficient epitaxial growth without two (2) dimensional nucleation.

As shown in FIG. 17, in the case of epitaxial growth on a defect-free mesa surface (i.e., a surface with no additional step sources), it is desired step-flow crystal growth produce a step-free mesa surface. The initial seed plane 106 grows laterally and becomes the top of the final step-free surface since two-dimensional nucleation is totally suppressed during the process in a manner as more fully described in U.S. Pat. Nos. 5,915,194 and 6,165,874. The prior art processes, such as that disclosed in U.S. Pat. Nos. 5,915,194 and 6,165,874, enable the growth of arrays of small-area step-free (i.e., atomically flat) SiC surfaces on commercial wafers. However, in the prior art processes for commercial SiC wafers, the size of step-free surfaces is limited by screw dislocations and other extended crystal defects that act as unwanted step sources in the original substrate. If a screw dislocation is contained within the surface of the initial mesa, then steps from the screw dislocation dominate the step flow growth and hillocks of the substrate 24 polytype form on the mesa top as discussed in the previously mentioned reference of Powell, Neudeck et al. These disadvantages limit the benefits of the prior art processes. More particularly, as discussed in the "Background Section," the prior art substrate defects and processes impose a practical limitation on the step-free surface areas to about 200 $\mu m \times 200 \mu m$.

In accordance with the present invention, epitaxial SiC film growth, generally illustrated in FIG. 16, is carried out under conditions that promote the lateral growth having cantilevered web features, as previously described, of a SiC film structure 24 that includes the initial seed plane 106 and which grows laterally to form a step-free surface and then beyond to form the enlarged desired device area. For the practice of the present invention, it is preferred that the desired device area be in excess of 200 $\mu m \times 200 \mu m$. During this lateral growth process, the step-free initial seed plane 106 grows laterally, in direction 96 or 96A, and expands beyond the limits set by the pre-growth mesa pattern area to reach the larger sized desired device area. To achieve the desired result, growth proceeds in a manner that promotes extended lateral growth of the mesa sidewalls 110 near the top of the mesas relative to the rest of the mesa sidewalls, resulting in thin cantilevered film structures 110A overhanging the vertical mesa sidewalls 110, to be further described hereinafter with respect to FIG. 18.

This desired growth enables the top cantilevered thin layer 110A to be grown without disturbances from extended defects (e.g. screw dislocations) from the substrate below. This non-disturbance prevents extended defects in the substrate below from propagating into the top surfaces of the laterally growing crystal films.

The desired end result of the practice of the present invention is an array of large step-free device surfaces that are not affected by the extended defects (e.g., screw dislocations) in the material below the top surface of the crystal. The thin cantilever film structure 110A overhanging the vertical mesa sidewalls 110, may be further described with reference to FIG. 18.

Figure 18:
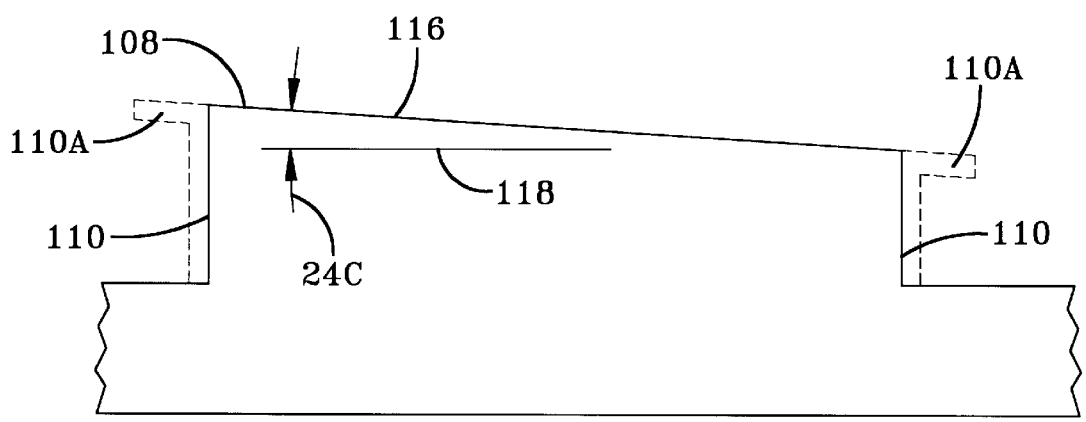
FIG. 18 illustrates a cross-section of a mesa having a step-free mesa top surface with lateral growths extending from the top surface of the mesa as well as the sidewalls of the mesa.

FIG. 18 illustrates a step-free mesa surface (0001) crystal surface 116 in which an angle 24C is measured relative to line 118. Line 118 is parallel to the original substrate surface of substrate 24 as shown by reference number 112 of FIG. 17(A). The angle 24C is measured between the line 118 and the step-free mesa basal plane surface 116.

FIG. 18 further illustrates lateral growth of the step-free surfaces shown (in phantom) as edges 110A. It should be noted that the edges 110 shown in solid correspond to the edges 98 of FIG. 14A representing the edges thereof before the epitaxial growth portion of the process of the present invention starts, and lateral growth 110A shown in phantom correspond to the edges 98 of FIG. 16A representing the edges thereof after the growth process of the present invention has been completed.

In the practice of the present invention, by properly controlling the growth conditions to suppress 2D nucleation on the top surface, crystal growth molecules that impinge from the growth species onto the step-free surface 106 must surface diffuse to the mesa sidewall 110 to find steps to epitaxially incorporate into the single crystal. Because the vertical mesa sidewall 110 has a very high step density, species that spill over the edge 110 of the mesa incorporate into the sidewall very near (within a micrometer of) the top of the mesa sidewall. The enhanced flow of crystal growth reactants collected by the step-free top surface area 116 and diffusing to the edge 110 of the mesa leads to enhanced lateral growth at the top of the mesa, forming the cantilever structure. It is important to note that all crystallographic lattice information for atoms forming the cantilever come laterally from the mesa edge 110, instead of vertically from the substrate below. Therefore, the cantilever crystal lattice grows without displacement and/or stress from screw dislocations lying underneath the cantilevers. Therefore, the crystal structure of the cantilevers is established without structure disorder of the underlying screw dislocations. Thus, a screw dislocation under the cantilever cannot propagate into the cantilevered film, and is thus terminated in a manner not possible with prior art processes.

It is contemplated that there are many types of growth processes and growth conditions that can be used to carry out the practice of the present invention. For example, chemical vapor deposition (CVD) or sublimation growth processes could be used. Growth conditions include (but are not limited to) the temperature, pressure, gas flow rates, carrier gas, types of sources for the silicon and carbon, and doping gases.

It is contemplated that the present invention is applicable to commercially available boule-derived wafers.

All descriptions of the preferred embodiment so far have only described the growth of SiC films on SiC substrates. Another important application of the invention is the growth of low-defect single-crystal films of AlN and GaN and other III-nitride alloys. These are important optoelectronic and high temperature and high frequency electronic materials. In fact, research on these nitrides has expanded dramatically over the last several years because of their potential use in the fabrication of short-wavelength diode lasers and high power, high frequency microwave applications.

The invention can be readily applied to the growth of AlN and/or GaN on SiC substrates because these nitrides are fairly closely lattice matched to SiC. The process of the present invention can be modified for nitride growth in the following manner. The substrate can be 6H SiC and can be processed as was described previously. All process procedures up through the growth of atomically-flat, step-free surfaces, 6H SiC epilayers would be carried out. Then the procedures that are known to those skilled in the art of nitride growth could be applied to the specially prepared 6H SiC substrate with atomically-flat regions having step-free surfaces. The advantage of the atomically-flat growth, step-free surfaces, provided by the practice of the present invention is that the nitride islands that nucleate will have the same orientation, rather than random orientations and other step related defects that occur in growth on substrates with atomic scale steps. There are various combinations of growth procedures that can be used. For example, AlN, GaN, or AlGaN could be grown directly on the atomically-flat, step-free surfaces, 6H SiC mesas or AlN could be used as a buffer layer between a GaN epitaxial layer and the 6H SiC substrate. In either case, the defect density in the nitride epilayers should be significantly lower than obtainable in epilayers grown by prior processes on commercially available SiC or sapphire substrates.

As is known in the art, it is common practice to insert additional heteroepitaxial layers that serve as buffer layers to reduce stress and defects between heteroepitaxial films. AlN and AlGaN are examples of buffer layers used for growth of GaN on SiC and sapphire.

Another embodiment of the invention is a method of producing single-crystal SiC substrate. The method comprising the steps of preparing a planar growth surface on the substrates that is parallel to within a predetermined angle relative to a selected crystal plane of said substrate. This preparation may be done in a manner as previously described.

The method further comprises removing material in the planar growth surface so as to define at least one selected separated area having boundaries that define a selected shape to promote cantilevered growth, and does not require a concave surface described for the other embodiment of the present invention. The method then continues by depositing a homoepitaxial film over the at least one selected area having the shape to promote the cantilevered growth under selected conditions so as to provide a step-flow growth while suppressing two-dimensional nucleation.

It is preferred that before the deposition step is performed, the substrate be first treated so as to remove any removable source of unwanted crystal nucleation and removable unwanted sources of steps in a manner as previously described. The method further comprises continuing the deposition of the homoepitaxial film until the step-flow growth produces an atomically-flat epitaxial film surface and cantilevered growth on each of said at least one separated area where the atomically-flat surface is parallel to said selected crystal plane. The method also contemplates a second growth surface having multiple boundaries.

The invention has been described with reference to a preferred embodiment and alternates thereof. It is believed that many modifications and alterations to the embodiment as discussed herein will readily suggest themselves to those skilled in the art upon reading and understanding the detailed description of the invention. It is intended to include all such modifications and alterations insofar as they come within the scope of the present invention.

What we claim is:

1. A method of producing single-crystal structures with cantilevered web features on a single-crystal substrate, said method comprising the steps of:
    (a) choosing a single crystal substrate material which exhibits the property that the material contains at least one growth plane orientation whereby under selected growth conditions the growth rate due to step-flow growth is greater than at least one hundred (100) times a growth rate due to growth involving two-dimensional nucleation;
    (b) preparing a planar first growth surface on said substrate that is parallel to within a predetermined angle relative to a selected crystal plane of said substrate;
    (c) removing material in said first growth surface so as to define at least one selected separated second growth surface defined by a boundary wherein said boundary has at least one concave border;
    (d) treating said substrate so as to remove any removable sources of unwanted crystal nucleation and any removable sources of steps;
    (e) depositing a homoepitaxial film on said second separated growth surface under selected conditions so as to provide a step-flow growth while suppressing two-dimensional nucleation;
    (f) continuing said deposition of said homoepitaxial film so that said step-flow growth results and produces a cantilevered web structure growing from said at least one of the concave border; and
    (g) continuing said deposition of said homoepitaxial film starting from said produced cantilevered web structure until a third selected separated growth surface of a desired size and shape is achieved and consisting of a continuous composition devoid of coalescence regions.

2. The method according to claim 1, wherein said selected crystal plane is the basal plane.

3. The method according to claim 1, wherein a planar area of said second growth surface boundary is selected to be less than ten times the mathematical inverse of a density of non-removable step sources contained in said substrate.

4. The method according to claim 1, wherein said predetermined angle is less than 1 degree.

5. The method according to claim 4, wherein said at least one selected separated second growth surface comprises an array of separated second growth surfaces.

6. The method according to claim 5, wherein said single-crystal substrate is selected from the group consisting of 6H-SiC; 4H-SiC; 15R-SiC; 2H-GaN; and 2H-AlN.

7. The method according to claim 6, wherein said selected boundary shape is formed by the joining of selected simple branch shapes to form said concave border that promotes web growth.

8. The method according to claim 7, wherein said selected branch shapes each have a length dimension greater than the width dimension of said selected branch shapes.

9. The method according to claim 8, wherein said selected branch shapes are selected to be joined in one or more of the following configurations that provide for one or more concave border portions that promote web growth; a V-shape; a U-shape; a multiple joined V-shape; a multiple joined U-shape; and a tree; and combinations thereof.

10. The method according to claim 9, wherein a planar area of said second growth surface boundary is selected to be less than ten times the mathematical inverse of a density of non-removable step sources contained in said substrate.

11. The method according to claim 10, wherein a size area of completed resulting web growth structure is selected to be a size of a desired area and shape.

12. The method according to claim 9, wherein said selected branch shapes of said configurations are oriented so that their lengths lie parallel in a direction selected from the group consisting of crystal vertex and crystal facet directions.

13. The method according to claim 12, wherein an orientation of said selected shape configurations is selected so that the root of the said selected shape configuration contains the highest initial crystal seed plane of the said second selected separated surface.

14. The method according to claim 13, wherein all branches flow toward a general down-step direction.

15. The method according to claim 14, wherein an atomically flat epitaxial film surface is obtained where said atomically flat surface is parallel to said selected crystal plane.

16. The method according to claim 15 further comprising the steps of:

(h) depositing a desired heteroepitaxial film on said atomically flat epitaxial film surface under predetermined conditions that preferably cause two-dimensional nucleation accompanied by step-flow growth of said desired heteroepitaxial film; and (i) continuing said depositing of said step (h) until a desired thickness is obtained.

17. The method according to claim 16 further comprising the steps of growing multiple heteroepitaxial films.

18. The method according to claim 10, wherein an atomically flat epitaxial film surface is obtained where said atomically flat surface is parallel to said selected crystal plane.

19. The method according to claim 18 further comprising the steps of:

(h) depositing a desired heteroepitaxial film on said atomically flat epitaxial film surface under predetermined conditions that preferably cause two-dimensional nucleation accompanied by step-flow growth of said desired heteroepitaxial film; and (i) continuing said depositing of said step (h) until a desired thickness is obtained.

20. The method according to claim 19 further comprising the steps of growing multiple heteroepitaxial films.

21. The method according to claim 12, wherein an atomically flat epitaxial film surface is obtained where said atomically flat surface is parallel to said selected crystal plane.

22. The method according to claim 21 further comprising the steps of:

(h) depositing a desired heteroepitaxial film on said atomically flat epitaxial film surface under predetermined conditions that preferably cause two-dimensional nucleation accompanied by step-flow growth of said desired heteroepitaxial film; and (i) continuing said depositing of said step (h) until a desired thickness is obtained.

23. The method according to claim 22 further comprising the steps of growing multiple heteroepitaxial films.

24. The method according to claim 1, wherein said steps (a)–(g) of claim 1 produce said single-crystal structures comprising a product having said cantilevered web structure and said product is a semiconductor device.

25. The method according to claim 24, wherein said step (b) is accomplished by forming trenches.

26. The method according to claim 24, wherein said step (b) is accomplished by cutting the said substrate apart.

27. The method according to claim 24, wherein said step (b) is accomplished by physical means.

28. The method according to claim 27, wherein said physical means is selected from the group comprising photolithography, laser etching, ion etching, photochemical etching, electrochemical etching, and photoelectrochemical etching.

29. The method according to claim 1, wherein said steps (a)–(g) of claim 1 produce said single-crystal structures comprising a product having said cantilevered web structure and said product is a micromachined device.

30. A method for producing cantilevered atomically flat top surfaces on single-crystal substrates, said method comprising the steps of:

(a) choosing a single crystal substrate material which exhibits the property that the material contains at least one growth plane orientation whereby under selected growth conditions the growth rate due to step-flow growth is greater than at least one hundred (100) times a growth rate due to growth involving two-dimensional nucleation;

(b) preparing a planar first growth surface on said substrate that is parallel to within a predetermined angle relative to a selected crystal plane of said substrate;

(c) removing material in said first growth surface so as to define at least one selected separated second growth surface defined by a single continuous boundary;

(d) depositing a homoepitaxial film on said second separated growth surface under selected conditions so as to provide a step-flow growth while suppressing two-dimensional nucleation;

(e) continuing said deposition of said homoepitaxial film so that said step-flow growth results and produces a cantilevered structure growing on said second growth surface; and (f) continuing said deposition of said homoepitaxial film starting from said produced cantilevered structure until a cantilevered structure with atomically-flat surface of a desired size and shape is achieved and consisting of a continuous composition devoid of coalescence regions.

31. The method according to claim 30 further comprising an added step occurring before step (c) and after step (b), said added step comprising, treating said substrate so as to remove any removable sources of unwanted crystal nucleation and remove any removable unwanted sources of steps.

32. The method according to claim 31, wherein said any source of unwanted crystal nucleation are contributed to by said single crystal substrate and by said steps (a) and (b).

33. The method of claim 31, wherein said any source of unwanted steps are contributed to by said crystal substrate and steps (a) and (b).

34. The method according to claim 31, wherein said added step is an etch in a gaseous mixture of hydrogen chloride and hydrogen at a temperature greater than 1000° C. to remove sources of removable unwanted crystal nucleation.

35. The method according to claim 30, wherein the said single-crystal substrate is alpha-SiC.

36. The method according to claim 35, wherein the said single-crystal substrate is 6H-SiC.

37. The method according to claim 35, wherein the said single-crystal substrate is 4H-SiC.

38. The method according to claim 30, wherein said at least one separated selected growth surface comprises an array of separated areas.

39. The method according to claim 30, wherein a size of said separated areas is approximately equal to that of one of desired semiconductor devices and integrated circuits.

40. The method according to claim 30, wherein said single crystal substrate is selected from the group comprising polytypes of silicon carbide.

41. The method according to claim 30, wherein said predetermined angle is less than 1 degree.

42. The method according to claim 30, wherein said steps (a)–(f) of claim 24 produce a product having cantilevered atomically-flat top surfaces on said single-crystal substrates and said product is a semiconductor device.

43. The method according to claim 30, wherein said selected crystal plane is the basal (0001) plane.

44. The method according to claim 30 further comprising the steps:

(g) depositing a desired heteroepitaxial film on said homoepitaxial film under predetermined conditions that preferably cause two-dimensional nucleation accompanied by step-flow growth of said desired heteroepitaxial film; and (h) continuing said depositing of said step (g) of said heteroepitaxial film until a desired thickness is obtained.

45. The method according to claim 44, wherein the said heteroepitaxial film is 3C-SiC.

46. The method according to claim 44, wherein said heteroepitaxial film is a III-Nitride compound.

47. The method according to claim 46, wherein the said heteroepitaxial film is GaN.

48. The method according to claim 46, wherein the said heteroepitaxial film is AlN.

49. The method according to claim 46, wherein the said heteroepitaxial film is AlGaN.

50. The method according to claim 44, wherein said at least one separated selected growth surface comprises an array of separated areas and wherein said heteroepitaxial film comprises SiC and said method further comprising the steps:

(i) continuing the growth of the said heteroepitaxial film under selected conditions so as to provide a step-flow growth while suppressing two-dimensional nucleation; and (j) continuing said deposition of said heteroepitaxial film until said step-flow growth produces atomically-flat epitaxial film surface and cantilevered growth on each of said at least one separated area where said atomically-flat surface is parallel to said selected crystal plane.

51. The method according to claim 50, wherein said heteroepitaxial film comprises adjacent layers that are brought together with a buffer layer that reduces the stress between adjacent layers.

* * * * *